United States Patent
Yamamoto et al.

(10) Patent No.: US 8,471,834 B2
(45) Date of Patent: Jun. 25, 2013

(54) DISPLAY DEVICE, METHOD OF LAYING OUT WIRING IN DISPLAY DEVICE, AND ELECTRONIC DEVICE

(75) Inventors: Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 961 days.

(21) Appl. No.: 12/453,753

(22) Filed: May 21, 2009

(65) Prior Publication Data

US 2009/0294163 A1 Dec. 3, 2009

(30) Foreign Application Priority Data

Jun. 3, 2008 (JP) ................................. 2008-145376

(51) Int. Cl.
*G09G 5/00* (2006.01)
(52) U.S. Cl.
USPC ........... 345/204; 345/206; 345/208; 345/209; 345/210; 345/212
(58) Field of Classification Search
USPC .... 345/76–82, 204–212; 174/261; 315/169.3; 313/463, 509, 505; 370/536; 359/30; 349/39, 349/46, 113, 114; 257/292, 628
See application file for complete search history.

(56) References Cited

U.S. PATENT DOCUMENTS

| | | | | |
|---|---|---|---|---|
| 6,380,918 B1 * | 4/2002 | Chiba et al. | ...................... | 345/90 |
| 6,845,016 B2 * | 1/2005 | Matsueda | ...................... | 361/772 |
| 7,028,898 B2 * | 4/2006 | Chang | ........................... | 235/454 |
| 7,170,504 B2 * | 1/2007 | Noguchi et al. | ............... | 345/204 |
| 7,236,149 B2 * | 6/2007 | Yamashita et al. | ............... | 345/76 |
| 7,324,351 B2 * | 1/2008 | Aoki | .............................. | 361/777 |
| 7,619,602 B2 * | 11/2009 | Shin | ................................. | 345/98 |
| 7,633,592 B2 * | 12/2009 | Kobashi et al. | ............... | 349/152 |
| 7,675,491 B2 * | 3/2010 | Ogura | .............................. | 345/76 |
| 7,738,152 B2 * | 6/2010 | Butler et al. | .................... | 359/30 |

(Continued)

FOREIGN PATENT DOCUMENTS

| | | |
|---|---|---|
| JP | 2002-107753 A | 4/2002 |
| JP | 2004-206056 A | 7/2004 |

(Continued)

OTHER PUBLICATIONS

Japanese Office Action issued May 18, 2010 for corresponding Japanese Application No. 2008-145376.

(Continued)

*Primary Examiner* — Prabodh M Dharia
(74) *Attorney, Agent, or Firm* — Rader, Fishman & Grauer PLLC

(57) ABSTRACT

A display device includes: a pixel array section having pixels arranged in a form of a matrix on a display panel; a first terminal group disposed on the display panel so as to correspond to each control line of a first control line group arranged in each pixel row of the pixel array section; a first wiring group for electrically connecting each terminal of the first terminal group to each control line of the first control line group; a second terminal group disposed on the display panel for a second control line group arranged in each pixel row of the pixel array section with a plurality of control lines as a unit; and a second wiring group for electrically connecting each terminal of the second terminal group to each control line of the second control line group through parts between the terminals of the first terminal group.

9 Claims, 27 Drawing Sheets

U.S. PATENT DOCUMENTS

| | | | |
|---|---|---|---|
| 7,772,766 B2* | 8/2010 | Aoki | 313/506 |
| 7,868,854 B2* | 1/2011 | Kanda | 345/77 |
| 8,102,336 B2* | 1/2012 | Uchino et al. | 345/76 |
| 2003/0193792 A1* | 10/2003 | Chang | 361/778 |
| 2004/0061694 A1* | 4/2004 | Noguchi et al. | 345/204 |
| 2004/0115989 A1* | 6/2004 | Matsueda et al. | 439/577 |
| 2004/0245641 A1* | 12/2004 | Eguchi | 257/758 |
| 2005/0007357 A1* | 1/2005 | Yamashita et al. | 345/204 |
| 2005/0024305 A1* | 2/2005 | Park | 345/82 |
| 2005/0116919 A1* | 6/2005 | Shin | 345/100 |
| 2005/0117611 A1* | 6/2005 | Shin | 370/536 |
| 2005/0121672 A1* | 6/2005 | Yamazaki et al. | 257/59 |
| 2005/0162605 A1* | 7/2005 | Murade | 349/152 |
| 2005/0186839 A1* | 8/2005 | Matsueda et al. | 439/577 |
| 2005/0241853 A1* | 11/2005 | Aoki | 174/261 |
| 2006/0017672 A1* | 1/2006 | Aoki | 345/77 |
| 2006/0103412 A1* | 5/2006 | Kimura et al. | 324/770 |
| 2006/0132668 A1* | 6/2006 | Park et al. | 349/48 |
| 2007/0008266 A1* | 1/2007 | Kobashi et al. | 345/90 |
| 2007/0210995 A1* | 9/2007 | Ogura | 345/76 |
| 2008/0024529 A1* | 1/2008 | Asano et al. | 345/697 |
| 2008/0062092 A1* | 3/2008 | Kanda | 345/77 |
| 2008/0180463 A1* | 7/2008 | Ogura | 345/690 |
| 2008/0238836 A1* | 10/2008 | Uchino et al. | 345/76 |

FOREIGN PATENT DOCUMENTS

| | | |
|---|---|---|
| JP | 2006-133542 | 5/2006 |
| JP | 2006-284716 A | 10/2006 |
| JP | 2007-034000 A | 2/2007 |
| JP | 2008-039799 A | 2/2008 |

OTHER PUBLICATIONS

Japanese Office Action issued Mar. 1, 2011 for corresponding Japanese Application No. 2008-145376.

* cited by examiner

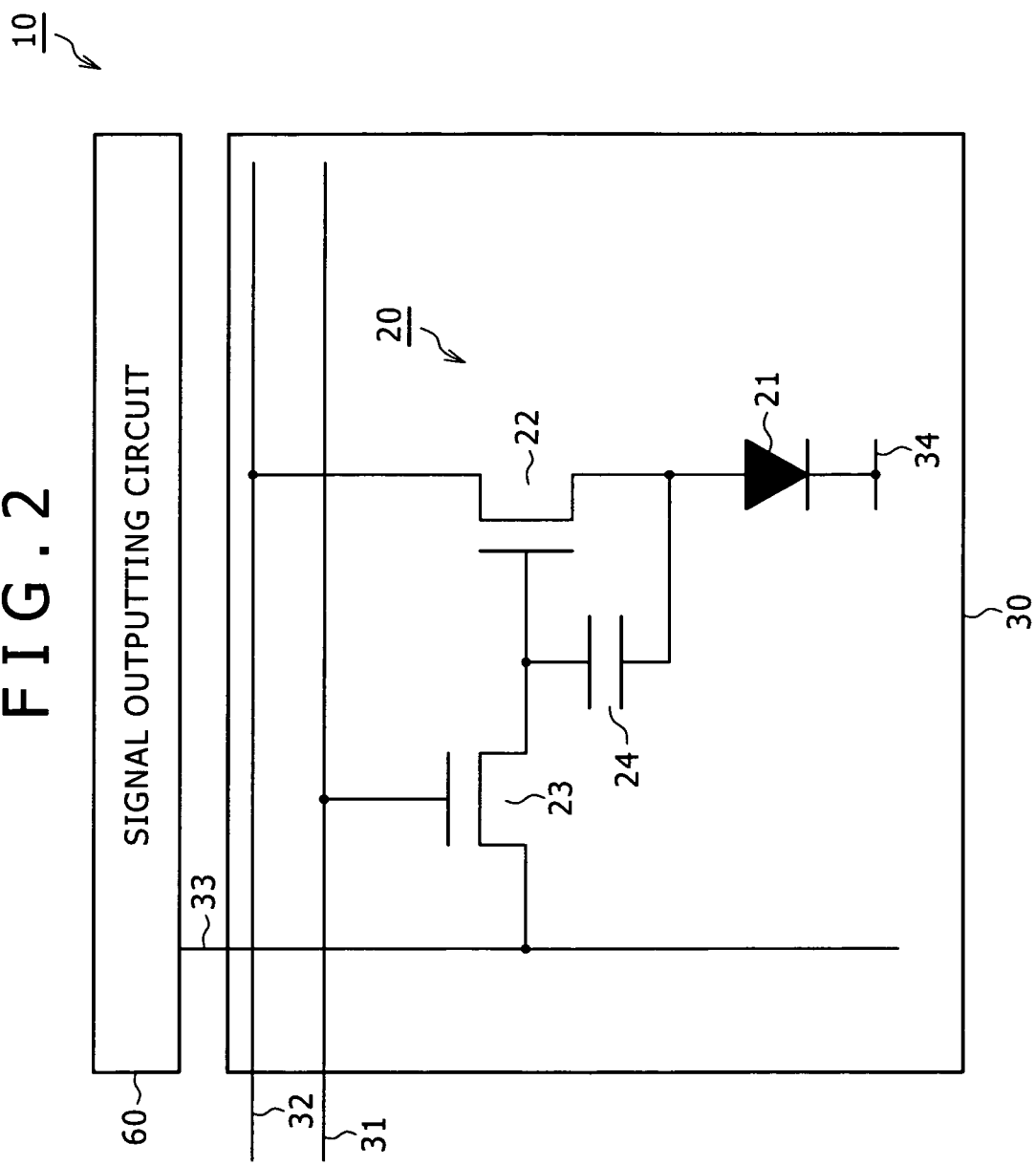

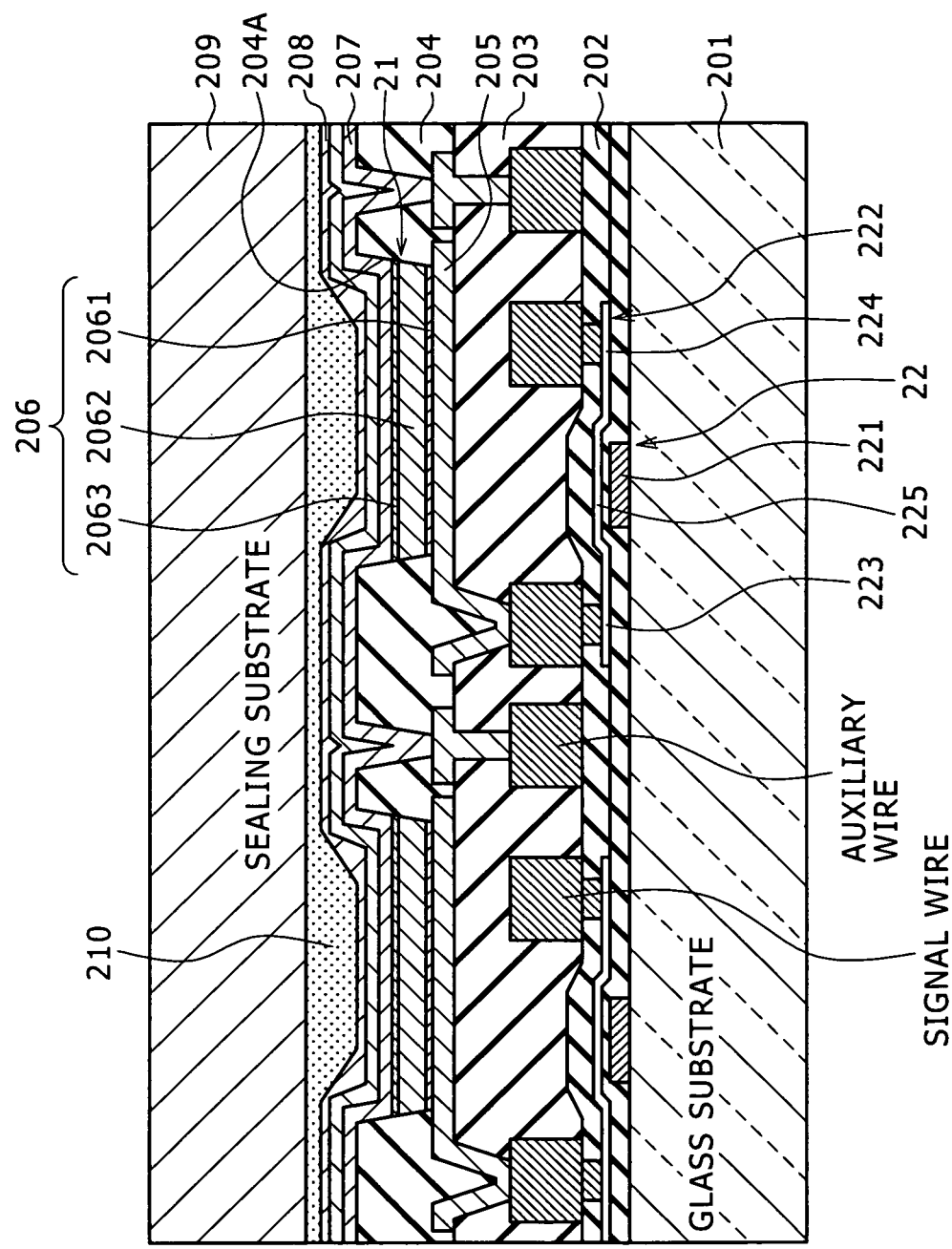

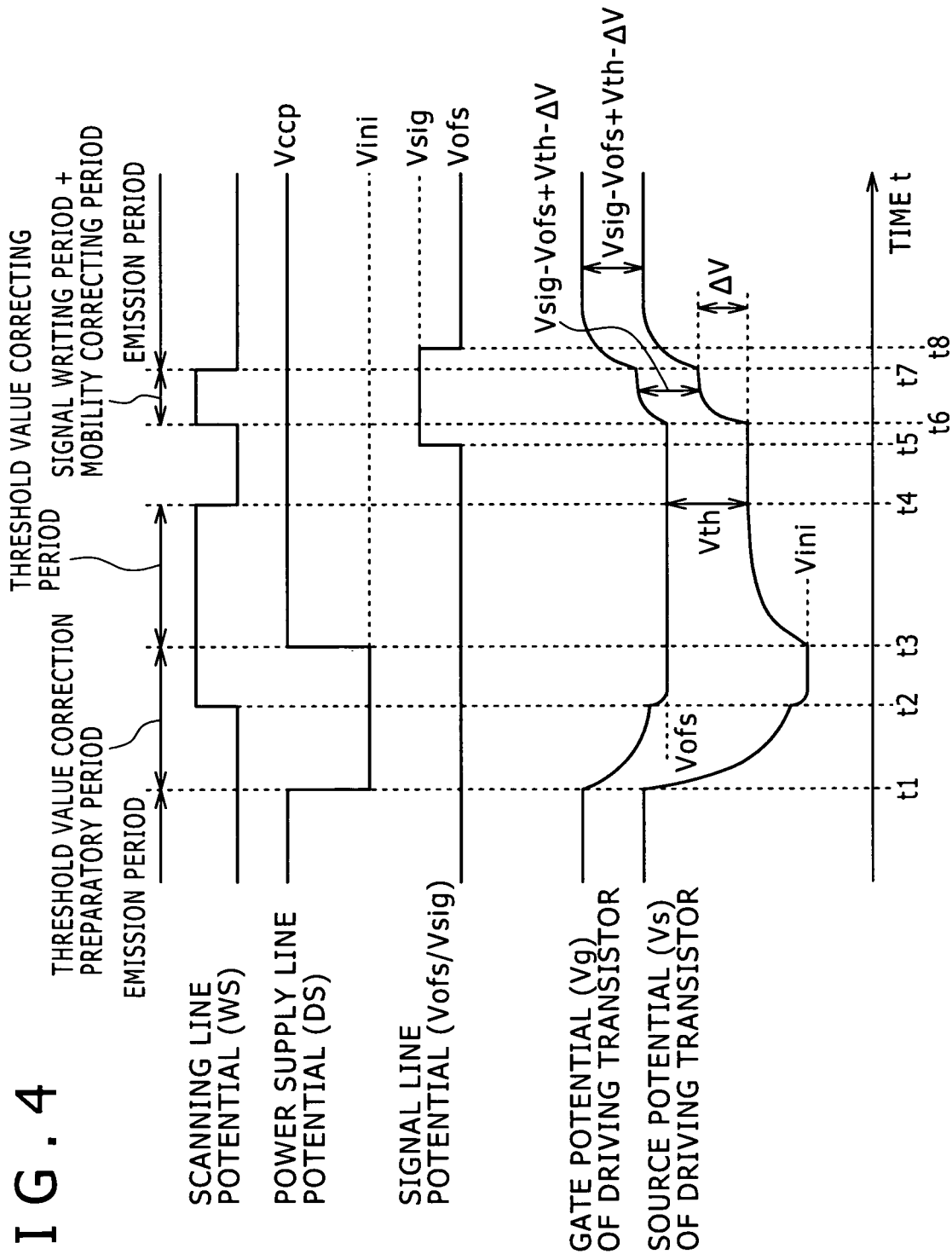

BEFORE t=t1 t=t1 t=t2 t=t3 t=t4 t=t5 t=t6 t=t7

BEFORE t=t11 t=t11 t=t13 t13<t<t14 t=t14 t=t15 t=t17 t=t18

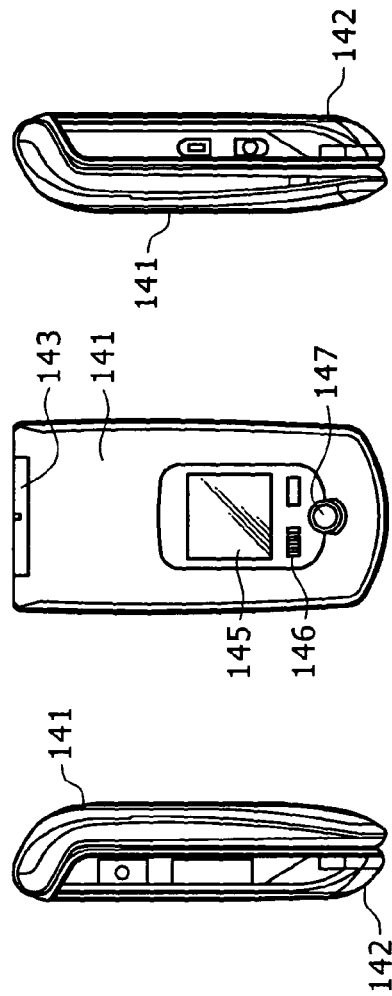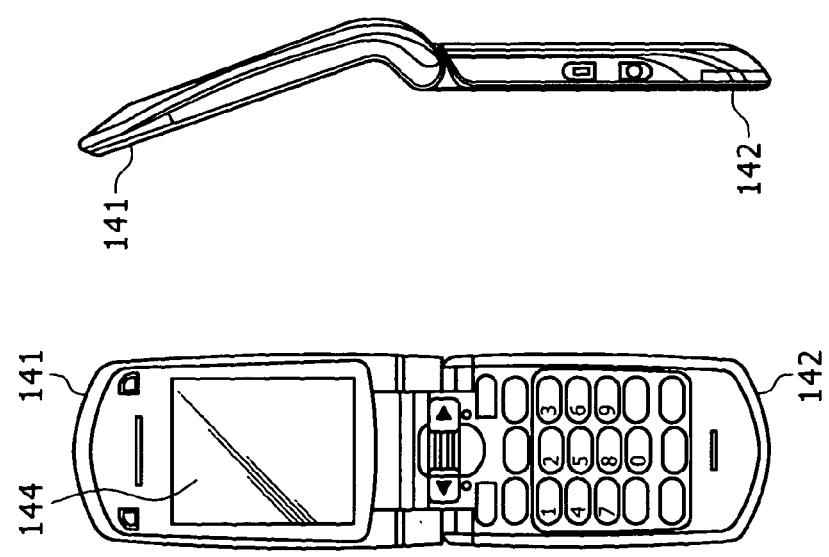

DISPLAY DEVICE, METHOD OF LAYING OUT WIRING IN DISPLAY DEVICE, AND ELECTRONIC DEVICE

BACKGROUND OF THE INVENTION

1. Field of the Invention

The present invention relates to a display device, a method of laying out wiring in a display device, and an electronic device, and particularly to a flat-panel type display device in which pixels including an electrooptic element are arranged two-dimensionally in the form of a matrix, a method of laying out wiring in the display device, and an electronic device having the display device.

2. Description of the Related Art

Recently, flat-panel type display devices in which pixels (pixel circuits) including a light emitting element are arranged in the form of a matrix have been spreading rapidly in a field of display devices displaying images. The development and commercialization of a flat-panel type display device using a so-called current-driven type electrooptic element changing in light emission luminance depending on the value of current flowing through the device as the light emitting element of a pixel, for example an organic EL display device using an organic EL (Electro Luminescence) element utilizing a phenomenon of light being emitted when an electric field is applied to an organic thin film as the light emitting element of a pixel have been under way.

The organic EL display device has the following features. The organic EL element can be driven by an application voltage of 10 V or lower, and thus consumes low power. Because the organic EL element is a self-luminous element, as compared with a liquid crystal display device that displays an image by controlling the intensity of light from a light source (backlight) in a liquid crystal in each pixel, the organic EL display device provides high image visibility, and is easily reduced in weight and thickness because an illuminating member such as a backlight is not required. Further, because the organic EL element has a very high response speed of a few μsec or so, no afterimage occurs at a time of displaying a moving image.

As with the liquid crystal display device, the organic EL display device can adopt a simple (passive) matrix system and an active matrix system as a driving system of the organic EL display device. However, while having a simple structure, a simple matrix type display device presents, for example, a problem of difficulty in realizing a large and high-definition display device because the emission period of an electrooptic element is reduced by an increase in the number of scanning lines (that is, the number of pixels).

Therefore, an active matrix type display device that controls current flowing through an electrooptic element by an active element, for example an insulated gate field effect transistor (typically a TFT (Thin Film Transistor)) provided within a same pixel circuit as the electrooptic element has recently been actively developed. The active matrix type display device makes it easy to realize a large and high-definition display device because the electrooptic element continues emitting light over the period of one frame.

It is generally known that the I-V characteristic (current-voltage characteristic) of the organic EL element is degraded with the passage of time (so-called secular degradation). In a pixel circuit using an N-channel type TFT as a transistor that current-drives an organic EL element (which transistor will hereinafter be described as "driving transistor"), when the I-V characteristic of the organic EL element is degraded with the passage of time, the gate-to-source voltage Vgs of the driving transistor changes, because the organic EL element is connected to the source electrode side of the driving transistor. As a result, the light emission luminance of the organic EL element also changes.

This will be described more specifically. The source potential of the driving transistor is determined by an operating point of the driving transistor and the organic EL element. When the I-V characteristic of the organic EL element is degraded, the operating point of the driving transistor and the organic EL element varies. Thus, even when a same voltage is applied to the gate of the driving transistor, the source potential of the driving transistor changes. Thereby, the gate-to-source voltage Vgs of the driving transistor changes, and therefore the value of current flowing through the driving transistor changes. As a result, the value of current flowing through the organic EL element also changes, so that the light emission luminance of the organic EL element changes.

Further, in a pixel circuit using a polysilicon TFT in particular, in addition to a secular degradation in the I-V characteristic of an organic EL element, there may occur secular changes in threshold voltage Vth of a driving transistor and in mobility μ of a semiconductor thin film forming the channel of the driving transistor (which mobility will hereinafter be described as "mobility of the driving transistor"), and there may be a difference in the transistor characteristics of the threshold voltage Vth and the mobility μ in each pixel due to variations in a manufacturing process (there are variations between the transistor characteristics of individual pixels).

When the threshold voltage Vth and the mobility μ of the driving transistor differ in each pixel, the value of current flowing through the driving transistor varies in each pixel. Thus, even when a same voltage is applied to the gate electrodes of driving transistors in respective pixels, the light emission luminance of the organic EL element varies between the pixels. As a result, screen uniformity is impaired.

Accordingly, in order to hold the light emission luminance of the organic EL element constant without being affected by a secular degradation in the I-V characteristic of the organic EL element or a secular change in the threshold voltage Vth or the mobility μ of the driving transistor even when the secular degradation occurs in the I-V characteristic of the organic EL element or the secular change occurs in the threshold voltage Vth or the mobility μ of the driving transistor, a constitution is adopted which constitution provides each of pixel circuits with a function of compensating for variations in the characteristic of the organic EL element and correcting functions of correcting for variations in the threshold voltage Vth of the driving transistor (which correction will hereinafter be described as "threshold value correction") and correcting for variations in the mobility μ of the driving transistor (which correction will hereinafter be described as "mobility correction") (see Japanese Patent Laid-Open No. 2006-133542 (hereinafter referred to as Patent Document 1), for example).

By thus providing each of the pixel circuits with the function of compensating for variations in the characteristic of the organic EL element and the correcting functions of correcting for variations in the threshold voltage Vth and the mobility μ of the driving transistor, the light emission luminance of the organic EL element can be held constant without being affected by a secular degradation in the I-V characteristic of the organic EL element or a secular change in the threshold voltage Vth or the mobility μ of the driving transistor even when the secular degradation occurs in the I-V characteristic of the organic EL element or the secular change occurs in the threshold voltage Vth or the mobility μ of the driving transistor. Therefore, the display quality of the organic EL display device can be improved.

The related techniques described in Patent Document 1 provide each of the pixel circuits with the function of compensating for variations in the characteristic of the organic EL element and the correcting functions of correcting for variations in the threshold voltage Vth and the mobility μ of the driving transistor. Thereby, the light emission luminance of the organic EL element can be held constant without being affected by a secular degradation in the I-V characteristic of the organic EL element or a secular change in the threshold voltage Vth or the mobility μ of the driving transistor even when the secular degradation occurs in the I-V characteristic of the organic EL element or the secular change occurs in the threshold voltage Vth or the mobility μ of the driving transistor.

SUMMARY OF THE INVENTION

A display device formed by arranging pixels including an electrooptic element such as an organic EL element in the form of a matrix generally has a constitution in which a plurality of control lines such as a scanning line and a power supply line are arranged for each pixel row (that may hereinafter be described as a "line") in the pixel arrangement in the form of a matrix and in which a control signal such as a scanning signal and a power supply voltage are supplied to pixels in each line through the plurality of control lines. In this case, each driver of a scanning driving system driving each of the plurality of control lines has output stages that correspond in number to each of the plurality of control lines arranged in each line.

On the other hand, recently, display devices have been improved in definition, and the number of pixels tends to increase in proportion to the improvement in definition. When the number of pixels increases, the number of lines (number of rows) also increases, and thus the number of output stages of each driver of the scanning driving system increases. Therefore, the circuit scale of the scanning driving system increases by the amount of the increase in the number of output stages of each driver of the scanning driving system. Then, an area occupied by the circuit part of the scanning driving system increases, so that the size of a panel module including the scanning driving system increases, thus limiting the incorporation of the panel module into electronic devices such as mobile devices.

When the number of output stages of the drivers of the scanning driving system can be reduced regardless of whether the number of lines is increased or not without adhering to an established idea of setting the number of output stages of each driver of the scanning driving system to a number corresponding to the number of lines, with the plurality of control lines such as the scanning lines and the power supply lines arranged in each line, the circuit scale of the scanning driving system is decreased by the amount of the reduction, and thus the area occupied by the circuit part of the scanning driving system can be reduced. Therefore, the size of the panel module can be reduced.

It is accordingly desirable to provide a display device that makes it possible to reduce the number of output stages of the drivers of the scanning driving system and to reduce the size of the panel module, a method of laying out wiring in the display device in reducing the number of output stages of the drivers of the scanning driving system, and an electronic device using the display device.

According to an embodiment of the present invention, there is provided a display device including: a pixel array section having pixels arranged in a form of a matrix on a display panel; a first terminal group disposed on the display panel so as to correspond to each control line of a first control line group arranged in each pixel row of the pixel array section; a first wiring group for electrically connecting each terminal of the first terminal group to each control line of the first control line group; a second terminal group disposed on the display panel for a second control line group arranged in each pixel row of the pixel array section with a plurality of control lines as a unit; and a second wiring group for electrically connecting each terminal of the second terminal group to each control line of the second control line group through parts between the terminals of the first terminal group, the second wiring group being arranged on an opposite side of the first terminal group from the pixel array section on the display panel.

The display device of the above-described constitution can be used as display devices of electronic devices in all fields that display a video signal input thereto or a video signal generated therein as an image or video, the electronic devices including for example digital cameras, notebook personal computers, portable terminal devices such as portable telephones, and video cameras.

In the display device of the above-described constitution and an electronic device having the display device, each terminal of the first terminal group is electrically connected to each control line of the first control line group by each piece of wiring of the first wiring group. Thereby, each control line of the first control line group and each output stage of a driver of a scanning driving system are associated with each other in one-to-one relation. On the other hand, each terminal of the second terminal group is electrically connected to the second control line group with X (X is an integer of two or more) control lines as a unit by each piece of wiring of the second wiring group. Thereby, each control line of the second control line group and each output stage of a driver of the scanning driving system are associated with each other in X-to-one relation.

That is, output stages of the driver for the first control line group are provided by the number of rows of the pixel array section, whereas output stages of the driver for the second control line group are provided by 1/X of the total number of rows of the pixel array section. Because the output stages of the driver for the second control line group can be reduced to 1/X of the total number of rows of the pixel array section, the circuit scale of the driver for the second control line group can be reduced as compared with a case of providing output stages of the driver for the second control line group by the number of rows of the pixel array section. Therefore, the circuit scale of the scanning driving system as a whole can be correspondingly reduced.

In addition, in adopting a constitution that drives each control line of the second control line group with X control lines as a unit for each output stage of the driver for the second control line group, a layout structure is formed in which the second wiring group is arranged on the opposite side of the first terminal group from the pixel array section, that is, on a panel edge side of the first terminal group on the display panel and in which each terminal of the second terminal group and each control line of the second control line group are electrically connected to each other through parts between the terminals of the first terminal group by each piece of wiring of the second wiring group. There are thus no parts where pieces of wiring of the second wiring group cross pieces of wiring of the first wiring group. Therefore, a cross short between pieces of wiring of the first wiring group and the second wiring group can be prevented.

According to another embodiment of the present invention, there is provided a method of laying out wiring in a display device, the display device including a pixel array section having pixels arranged in a form of a matrix on a display panel, a first terminal group disposed on the display panel so as to correspond to each control line of a first control line group arranged in each pixel row of the pixel array section, and a second terminal group disposed on the display panel for a second control line group arranged in each pixel row of the pixel array section with a plurality of control lines as a unit. The method includes the steps of: electrically connecting each terminal of the first terminal group to each control line of the first control line group by each piece of wiring of a first wiring group; and arranging a second wiring group on an opposite side of the first terminal group from the pixel array section on the display panel, and electrically connecting each terminal of the second terminal group to each control line of the second control line group through parts between the terminals of the first terminal group by each piece of wiring of the second wiring group.

In the display device employing a constitution that drives each control line of the second control line group with X control lines as a unit for each output stage of a driver for the second control line group, a layout structure is formed in which the second wiring group is arranged on the opposite side of the first terminal group from the pixel array section on the display panel and in which each terminal of the second terminal group and each control line of the second control line group are electrically connected to each other through parts between the terminals of the first terminal group by each piece of wiring of the second wiring group. There are thus no parts where pieces of wiring of the second wiring group cross pieces of wiring of the first wiring group. Therefore, a short (cross short) between pieces of wiring of the first wiring group and the second wiring group can be prevented.

According to a further embodiment of the present invention, there is provided an electronic device having a display device. The display device includes: a pixel array section having pixels arranged in a form of a matrix on a display panel; a first terminal group disposed on the display panel so as to correspond to each control line of a first control line group arranged in each pixel row of the pixel array section; a first wiring group for electrically connecting each terminal of the first terminal group to each control line of the first control line group; a second terminal group disposed on the display panel for a second control line group arranged in each pixel row of the pixel array section with a plurality of control lines as a unit; and a second wiring group for electrically connecting each terminal of the second terminal group to each control line of the second control line group through parts between the terminals of the first terminal group, the second wiring group being arranged on an opposite side of the first terminal group from the pixel array section on the display panel.

According to the embodiments of the present invention, the circuit scale of the driver for the second control line group can be reduced as compared with a case of providing output stages of the driver for the second control line group by the number of rows of the pixel array section. Therefore, the circuit scale of the scanning driving system as a whole can be correspondingly reduced. The size of the panel module can thus be reduced.

In addition, the layout structure in which pieces of wiring of the second wiring group do not cross pieces of wiring of the first wiring group can prevent a cross short between pieces of wiring of the first wiring group and the second wiring group. Therefore, a higher yield of the panel module can be achieved.

BRIEF DESCRIPTION OF THE DRAWINGS

FIG. 2 is a circuit diagram showing a concrete example of configuration of a pixel (pixel circuit);

FIG. 3 is a sectional view of an example of a sectional structure of a pixel;

FIG. 4 is a timing waveform chart of assistance in explaining the basic circuit operation of the organic EL display device as a premise of the present invention;

FIGS. 31A, 31B, 31C, 31D, 31E, 31F, and 31G are diagrams showing an external appearance of a portable telephone to which an embodiment of the present invention is applied, FIG. 31A being a front view of the portable telephone in an opened state, FIG. 31B being a side view of the portable telephone in the opened state, FIG. 31C being a front view of the portable telephone in a closed state, FIG. 31D being a left side view, FIG. 31E being a right side view, FIG. 31F being a top view, and FIG. 31G being a bottom view.

DETAILED DESCRIPTION OF THE PREFERRED EMBODIMENTS

Preferred embodiments of the present invention will hereinafter be described in detail with reference to the drawings.

[System Configuration]

Figure 1:
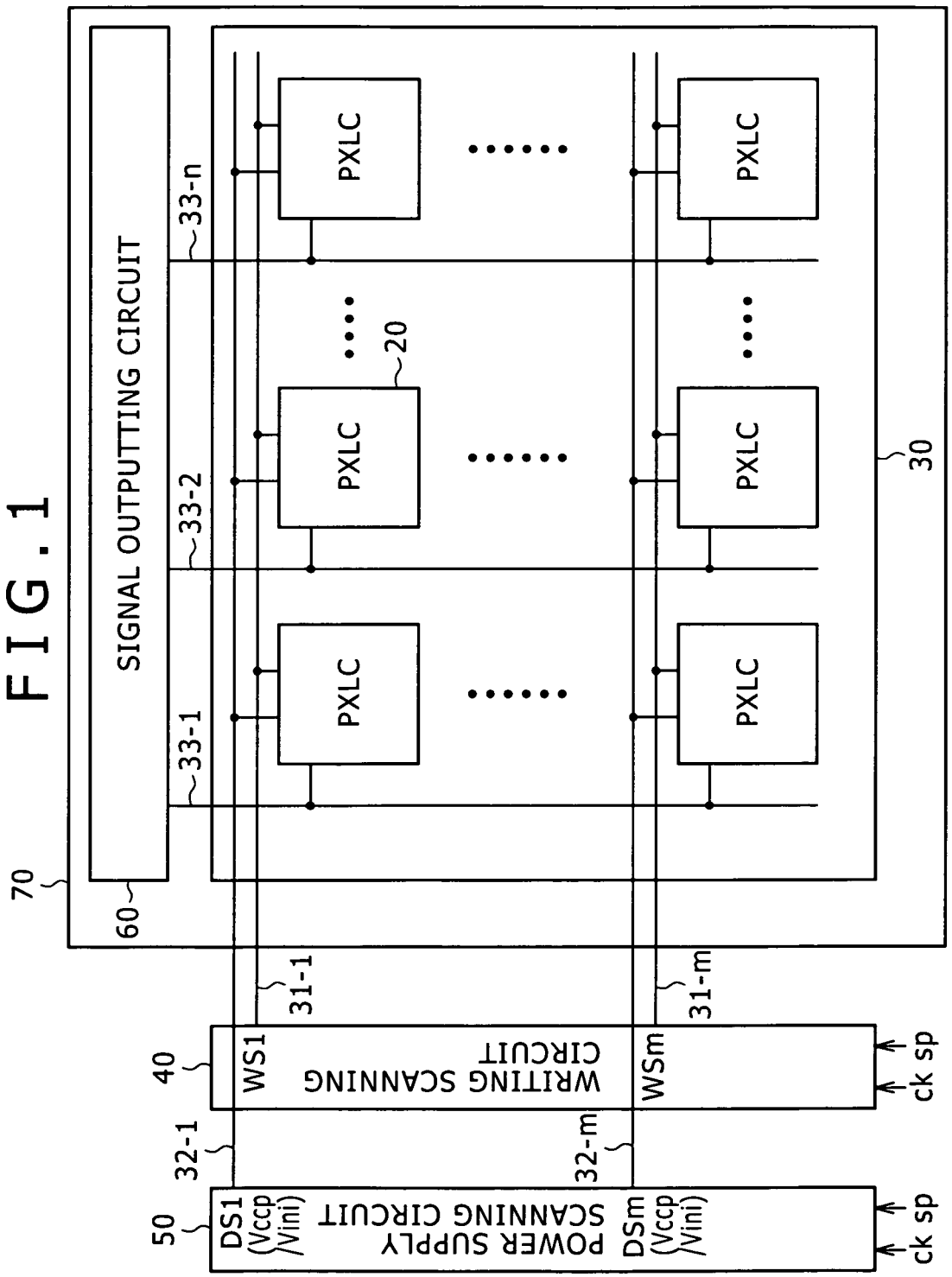
FIG. 1 is a system configuration diagram showing an outline of a configuration of an organic EL display device as a premise of the present invention.

FIG. 1 is a system configuration diagram showing an outline of a configuration of an active matrix type display device as a premise of the present invention.

Description in the following will be made by taking as an example an active matrix type organic EL display device using a current-driven type electrooptic element whose light emission luminance changes depending on the value of a current flowing through the device, for example an organic EL element (organic electroluminescent element) as light emitting elements of pixels (pixel circuits).

As shown in FIG. 1, the organic EL display device 10 as a premise of the present invention has a plurality of pixels (PXLC) 20 including light emitting elements, a pixel array section 30 in which the pixels 20 are arranged two-dimensionally in the form of a matrix, and a driving section for driving the pixels 20, the driving section being disposed on the periphery of the pixel array section 30.

As the driving section for driving the pixels 20, for example a scanning driving system including a writing scanning circuit 40 and a power supply scanning circuit 50 and a signal supplying system including a signal outputting circuit 60 are provided. In the case of the organic EL display device 10 as a premise of the present invention, the signal outputting circuit 60 is provided on a display panel 70 on which the pixel array section 30 is formed, whereas the writing scanning circuit 40 and the power supply scanning circuit 50 as the scanning driving system are provided outside the display panel 70.

In this case, when the organic EL display device 10 is a display device for color display, one pixel is formed by a plurality of sub-pixels, and the sub-pixels correspond to the pixels 20. More specifically, in a display device for color display, one pixel is formed of three sub-pixels, which are a sub-pixel emitting red (R) light, a sub-pixel emitting green (G) light, and a sub-pixel emitting blue (B) light.

However, one pixel is not limited to the combination of sub-pixels of three primary colors of RGB, and one pixel can be formed by further adding a sub-pixel of one color or sub-pixels of a plurality of colors to the sub-pixels of the three primary colors. More specifically, for example, one pixel can be formed by adding a sub-pixel emitting white light (W) to improve luminance, or one pixel can be formed by adding at least one sub-pixel emitting light of a complementary color to expand a color reproduction range.

For an arrangement of the pixels 20 of m rows and n columns, the pixel array section 30 has scanning lines 31-1 to 31-$m$ and power supply lines 32-1 to 32-$m$ arranged in each pixel row along a first direction (left-to-right direction/horizontal direction in FIG. 1), and has signal lines 33-1 to 33-$n$ arranged in each pixel column along a second direction (top-to-bottom direction/vertical direction in FIG. 1) orthogonal to the first direction.

In the organic EL display device 10 as a premise of the present invention, the scanning lines 31-1 to 31-$m$ are respectively connected to output terminals for the corresponding rows of the writing scanning circuit 40. The power supply lines 32-1 to 32-$m$ are respectively connected to output terminals for the corresponding rows of the power supply scanning circuit 50. The signal lines 33-1 to 33-$n$ are respectively connected to output terminals for the corresponding columns of the signal outputting circuit 60.

The pixel array section 30 is usually formed on a transparent insulating substrate such as a glass substrate. The organic EL display device 10 thereby has a plane type (flat type) panel structure. The driving circuit of each pixel 20 in the pixel array section 30 can be formed using an amorphous silicon TFT or a low-temperature polysilicon TFT.

The writing scanning circuit 40 is formed by a shift register sequentially shifting (transferring) a start pulse sp in order in synchronism with a clock pulse ck, or the like. At a time of writing a video signal to the pixels 20 of the pixel array section 30, the writing scanning circuit 40 sequentially supplies a writing pulse (scanning signal) (WS1 to WSm) to the scanning lines 31-1 to 31-$m$, and thereby scans the pixels 20 of the pixel array section 30 in row units in order (line-sequential scanning).

The power supply scanning circuit 50 is formed by a shift register sequentially shifting (transferring) the start pulse sp in order in synchronism with the clock pulse ck, or the like. The power supply scanning circuit 50 supplies power supply line potentials DS1 to DSm changing between a first power supply potential Vccp and a second power supply potential Vini lower than the first power supply potential Vccp to the power supply lines 32-1 to 32-$m$ in synchronism with the line-sequential scanning of the writing scanning circuit 40. Thereby, the power supply scanning circuit 50 controls the emission/non-emission of the pixels 20, and supplies a driving current to organic EL elements as light emitting elements.

The signal outputting circuit 60 appropriately selects one of the signal voltage Vsig of a video signal corresponding to luminance information supplied from a signal supplying source (not shown) external to the display panel 70 (the signal voltage Vsig may hereinafter be described simply as a "signal voltage") and a reference potential Vofs to write the pixels 20 of the pixel array section 30 in row units, for example, via the signal lines 33-1 to 33-n. That is, the signal outputting circuit 60 employs a line-sequential writing driving mode in which the signal voltage Vsig of the video signal is written in row (line) units.

(Pixel Circuit)

FIG. 2 is a circuit diagram showing a concrete example of configuration of a pixel (pixel circuit) 20.

As shown in FIG. 2, the pixel 20 is formed by a current-driven type electrooptic element whose light emission luminance changes depending on the value of a current flowing through the device, for example an organic EL element 21, and a driving circuit driving the organic EL element 21. The organic EL element 21 has a cathode electrode connected to a common power supply line 34 commonly wired to all the pixels 20 (so-called solid wiring).

The driving circuit driving the organic EL element 21 includes a driving transistor 22, a writing transistor (sampling transistor) 23, and a storage capacitor 24. In this case, an N-channel type TFT is used as the driving transistor 22 and the writing transistor 23. However, the combination of the conduction type of the driving transistor 22 and the conduction type of the writing transistor 23 is a mere example, and the present invention is not limited to the above combination.

Incidentally, when an N-channel type TFT is used as the driving transistor 22 and the writing transistor 23, an amorphous silicon (a-Si) process can be used. The use of the a-Si process can reduce the cost of the substrate on which the TFTs are made, and in turn reduce the cost of the organic EL display device 10. In addition, when the driving transistor 22 and the writing transistor 23 are of a same conduction type, both the transistors 22 and 23 can be made by a same process, and thus contribute to reduction in cost.

The driving transistor 22 has one electrode (source/drain electrode) connected to the anode electrode of the organic EL element 21, and has another electrode (drain/source electrode) connected to the power supply line 32 (power supply lines 32-1 to 32-m).

The writing transistor 23 has a gate electrode connected to the scanning line 31 (31-1 to 31-m), has one electrode (source/drain electrode) connected to the signal line 33 (signal lines 33-1 to 33-n), and has another electrode (drain/source electrode) connected to the gate electrode of the driving transistor 22.

In the driving transistor 22 and the writing transistor 23, the one electrode refers to metallic wiring electrically connected to a source/drain region, and the other electrode refers to metallic wiring electrically connected to a drain/source region. Depending on potential relation between the one electrode and the other electrode, the one electrode is the source electrode or the drain electrode, and the other electrode is the drain electrode or the source electrode.

The storage capacitor 24 has one electrode connected to the gate electrode of the driving transistor 22, and has another electrode connected to the other electrode of the driving transistor 22 and the anode electrode of the organic EL element 21.

Incidentally, the driving circuit for the organic EL element 21 is not limited to the circuit configuration composed of the two transistors of the driving transistor 22 and the writing transistor 23 and the one capacitance of the storage capacitor 24, but can be of a circuit configuration in which an auxiliary capacitance having an effect of supplying a lack of capacitance of the organic EL element 21 and increasing a gain in writing a video signal to the storage capacitor 24 is provided as required by connecting one electrode of the auxiliary capacitance to the anode electrode of the organic EL element 21 and connecting another electrode of the auxiliary capacitance to a fixed potential.

In the pixel 20 of the above configuration, the writing transistor 23 is set in a conducting state by responding to a high-level scanning signal WS applied from the writing scanning circuit 40 to the gate electrode of the writing transistor 23 via the scanning line 31. Thereby, the writing transistor 23 samples the signal voltage Vsig of a video signal corresponding to luminance information or the reference potential Vofs, the signal voltage Vsig or the reference potential Vofs being supplied from the signal outputting circuit 60 via the signal line 33, and writes the signal voltage Vsig or the reference potential Vofs into the pixel 20. The written signal voltage Vsig or the written reference potential Vofs is applied to the gate electrode of the driving transistor 22, and is also retained by the storage capacitor 24.

When the potential DS of the power supply line 32 (power supply lines 32-1 to 32-m) is the first power supply potential Vccp, the driving transistor 22 operates in a saturation region with the one electrode serving as a drain electrode and with the other electrode serving as a source electrode. Thereby, the driving transistor 22 is supplied with a current from the power supply line 32, and light-emission-drives the organic EL element 21 by current driving. More specifically, the driving transistor 22 operates in the saturation region and thereby supplies a driving current having a current value corresponding to the voltage value of the signal voltage Vsig retained by the storage capacitor 24 to the organic EL element 21 to make the organic EL element 21 emit light by current-driving the organic EL element 21.

Further, when the potential DS of the power supply line 32 (32-1 to 32-m) is changed from the first power supply potential Vccp to the second power supply potential Vini, the driving transistor 22 operates as a switching transistor with the one electrode serving as a source electrode and with the other electrode serving as a drain electrode. The driving transistor 22 thereby stops supplying the driving current to the organic EL element 21 to set the organic EL element 21 in a non-emission state. That is, the driving transistor 22 also has a function of a transistor that controls the emission/non-emission of the organic EL element 21.

A duty control is performed in which a period during which the organic EL element 21 is in a non-emission state (non-emission period) is provided by the switching operation of the driving transistor 22 to control a ratio (duty) between the emission period and the non-emission period of the organic EL element 21. Thereby, an afterimage blur involved in light emission of pixels over one frame period can be reduced. Thus, more excellent image quality of a moving image in particular can be achieved.

In this case, the reference potential Vofs selectively supplied from the signal outputting circuit 60 via the signal line 33 is a potential serving as a reference for the signal voltage Vsig of the video signal corresponding to the luminance information (for example, a potential corresponding to a black level).

Of the first power supply potential Vccp and the second power supply potential Vini selectively supplied from the power supply scanning circuit 50 via the power supply line 32, the first power supply potential Vccp is a power supply potential for supplying the driving current for light emission driving of the organic EL element 21 to the driving transistor 22. The second power supply potential Vini is a power supply potential for applying a reverse bias to the organic EL element 21. The second power supply potential Vini is set lower than the reference potential Vofs, or for example, letting Vth be the threshold voltage of the driving transistor 22, the second power supply potential Vini is set lower than Vofs−Vth and preferably set sufficiently lower than Vofs−Vth.

(Pixel Structure)

FIG. 3 is a sectional view of an example of a sectional structure of a pixel 20. As shown in FIG. 3, the pixel 20 has a constitution in which an insulating film 202, an insulating planarizing film 203, and a window insulating film 204 are formed in this order on a glass substrate 201 on which a driving circuit including a driving transistor 22 and the like is formed, and in which an organic EL element 21 is disposed in a concave part 204A of the window insulating film 204. In this figure, of the constituent elements of the driving circuit, only the driving transistor 22 is shown, and the other constituent elements are omitted.

The organic EL element 21 includes an anode electrode 205 made of a metal or the like formed in a bottom part of the concave part 204A of the window insulating film 204, an organic layer (electron transporting layer, a light emitting layer, and a hole transporting layer/hole injection layer) 206 formed on the anode electrode 205, and a cathode electrode 207 made of a transparent conductive film or the like formed on the organic layer 206 so as to be common to all pixels.

In this organic EL element 21, the organic layer 206 is formed by sequentially depositing a hole transporting layer/hole injection layer 2061, a light emitting layer 2062, an electron transporting layer 2063, and an electron injection layer (not shown) on the anode electrode 205. Under the current driving of the driving transistor 22 in FIG. 2, a current flows from the driving transistor 22 through the anode electrode 205 to the organic layer 206, so that light is emitted at a time of recombination of electrons and holes in the light emitting layer 2062 within the organic layer 206.

The driving transistor 22 is composed of a gate electrode 221, a source/drain region 223 provided on one side of a semiconductor layer 222, a drain/source region 224 provided on another side of the semiconductor layer 222, and a channel forming region 225 as a part opposed to the gate electrode 221 of the semiconductor layer 222. The source/drain region 223 is electrically connected to the anode electrode 205 of the organic EL element 21 via a contact hole.

As shown in FIG. 3, after the organic EL element 21 is formed in a pixel unit via the insulating film 202, the insulating planarizing film 203, and the window insulating film 204 on the glass substrate 201 on which the driving circuit including the driving transistor 22 is formed, a sealing substrate 209 is bonded by an adhesive 210 via a passivation film 208. The display panel 70 is formed by sealing the organic EL element 21 by the sealing substrate 209.

(Basic Circuit Operation of Organic EL Display Device)

The basic circuit operation of the organic EL display device 10 formed with the pixels 20 of the above-described configuration arranged two-dimensionally in the form of a matrix will next be described with reference to operation explanatory diagrams of FIGS. 5A, 5B, 5C, and 5D and FIGS. 6A, 6B, 6C, and 6D on the basis of a timing waveform chart of FIG. 4.

Incidentally, in the operation explanatory diagrams of FIGS. 5A to 5D and FIGS. 6A to 6D, the writing transistor 23 is represented by the symbol of a switch in order to simplify the drawings. An equivalent capacitance (parasitic capacitance) Cel of the organic EL element 21 is also shown in the figures.

The timing waveform chart of FIG. 4 shows changes in potential (scanning signal) WS of the scanning line 31 (31-1 to 31-m), changes in potential DS of the power supply line 32 (32-1 to 32-m), and changes in the gate potential Vg and the source potential Vs of the driving transistor 22.

<Emission Period of Preceding Frame>

A period before time t1 in the timing waveform chart of FIG. 4 is an emission period of the organic EL element 21 in a preceding frame (field). In the emission period of the preceding frame, the potential DS of the power supply line 32 is the first power supply potential (hereinafter described as a "high potential") Vccp, and the writing transistor 23 is in a non-conducting state.

Figure 5A:
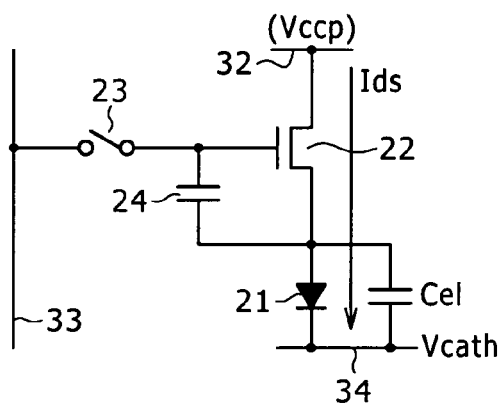
FIGS. 5A, 5B, 5C, and 5D are operation explanatory diagrams (1) of the basic circuit operation.

The driving transistor 22 is designed to operate in the saturation region at this time. Thereby, as shown in FIG. 5A, a driving current (drain-to-source current) Ids corresponding to the gate-to-source voltage Vgs of the driving transistor 22 is supplied from the power supply line 32 through the driving transistor 22 to the organic EL element 21. The organic EL element 21 thus emits light at a luminance corresponding to the current value of the driving current Ids.

<Threshold Value Correction Preparatory Period>

Figure 5B:
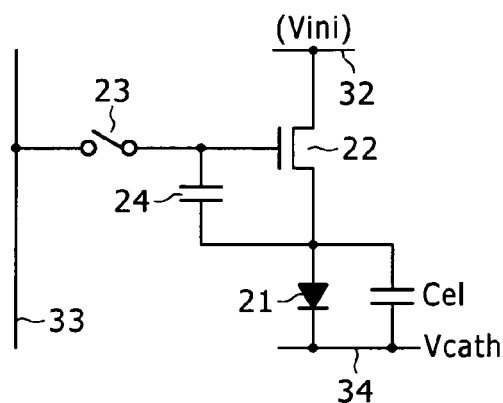

A new frame (present frame) of line-sequential scanning begins at time t1. As shown in FIG. 5B, the potential DS of the power supply line 32 is changed from the high potential Vccp to the second power supply potential (hereinafter described as a "low potential") Vini sufficiently lower than Vofs−Vth with respect to the reference potential Vofs of the signal line 33.

Letting Vthel be the threshold voltage of the organic EL element 21, and Vcath be the potential of the common power supply line 34, when the low potential Vini is set to be Vini<Vthel+Vcath, the source potential Vs of the driving transistor 22 becomes substantially equal to the low potential Vini, and thus the organic EL element 21 is set in a reverse-biased state and quenched.

Figure 5C:
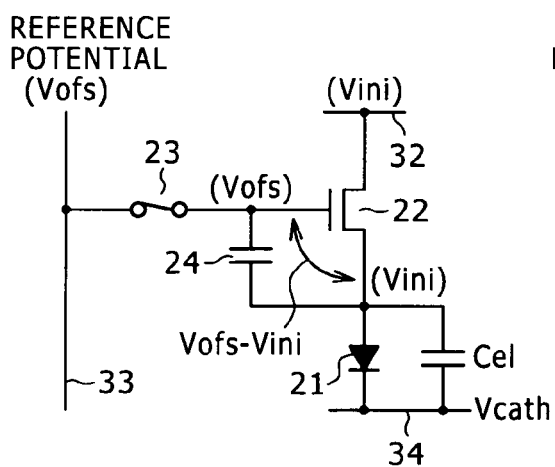

Next, at time t2, the potential WS of the scanning line 31 makes a transition from a low potential side to a high potential side, whereby the writing transistor 23 is set in a conducting state, as shown in FIG. 5C. At this time, because the reference potential Vofs is supplied from the signal outputting circuit 60 to the signal line 33, the gate potential Vg of the driving transistor 22 becomes the reference potential Vofs. The source potential Vs of the driving transistor 22 is the potential Vini, which is sufficiently lower than the reference potential Vofs.

At this time, the gate-to-source voltage Vgs of the driving transistor 22 is Vofs−Vini. A threshold value correcting process to be described later cannot be performed unless Vofs−Vini is larger than the threshold voltage Vth of the driving transistor 22. Therefore, a potential relation such that Vofs−Vini>Vth needs to be set.

The process of thus initializing the gate potential Vg and the source potential Vs of the driving transistor 22 by fixing (establishing) the gate potential Vg of the driving transistor 22 to the reference potential Vofs and the source potential Vs of the driving transistor 22 to the low potential Vini is the preparatory (threshold value correction preparatory) process before a threshold value correcting process to be described later is performed. Thus, the reference potential Vofs and the low potential Vini are respective initializing potentials for the gate potential Vg and the source potential Vs of the driving transistor 22.

<Threshold Value Correcting Period>

Figure 5D:
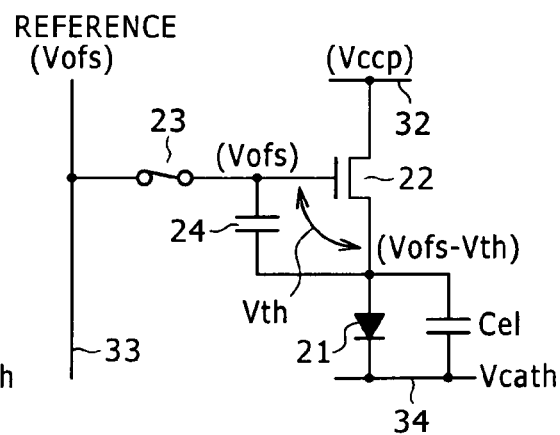

Next, when the potential DS of the power supply line 32 is changed from the low potential Vini to the high potential Vccp at time t3 as shown in FIG. 5D, the source potential Vs of the driving transistor 22 starts rising toward a potential obtained by subtracting the threshold voltage Vth of the driving transistor 22 from the gate potential Vg in a state of the gate potential Vg of the driving transistor 22 being maintained.

The gate-to-source voltage Vgs of the driving transistor 22 eventually converges to the threshold voltage Vth of the driving transistor 22. A voltage corresponding to the threshold voltage Vth is retained by the storage capacitor 24.

In this case, for convenience, a period during which a process is performed which process changes, or specifically raises the source potential Vs of the driving transistor 22 toward the potential obtained by subtracting the threshold voltage Vth of the driving transistor 22 from the initializing potential Vofs with the initializing potential (reference potential) Vofs for the gate electrode of the driving transistor 22 as a reference in the state of the gate potential Vg of the driving transistor 22 being maintained, detects the eventually converged gate-to-source voltage Vgs of the driving transistor 22 as the threshold voltage Vth of the driving transistor 22, and retains the voltage corresponding to the threshold voltage Vth in the storage capacitor 24 is referred to as a threshold value correcting period.

Incidentally, suppose that in this threshold value correcting period, in order for a current to flow only to the side of the storage capacitor 24 and not to flow to the side of the organic EL element 21, the potential Vcath of the common power supply line 34 is set such that the organic EL element 21 is in a cutoff state.

Figure 6A:
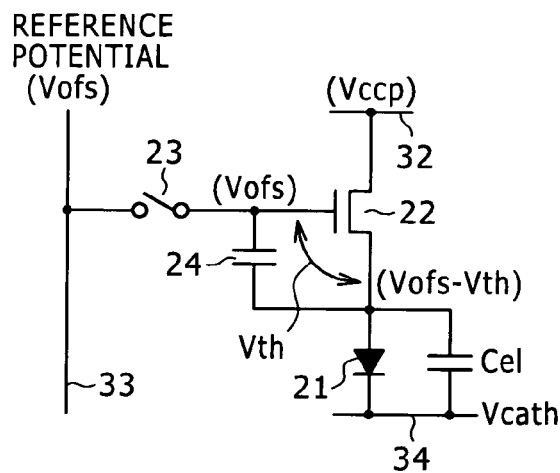
FIGS. 6A, 6B, 6C, and 6D are operation explanatory diagrams (2) of the basic circuit operation.

Next, the potential WS of the scanning line 31 makes a transition to the low potential side at time t4, whereby the writing transistor 23 is set in a non-conducting state as shown in FIG. 6A. At this time, the gate electrode of the driving transistor 22 is electrically disconnected from the signal line 33, and is thereby set in a floating state. However, because the gate-to-source voltage Vgs is equal to the threshold voltage Vth of the driving transistor 22, the driving transistor 22 is in a cutoff state. Therefore, the drain-to-source current Ids does not flow through the driving transistor 22.

<Signal Writing Period and Mobility Correcting Period>

Figure 6B:
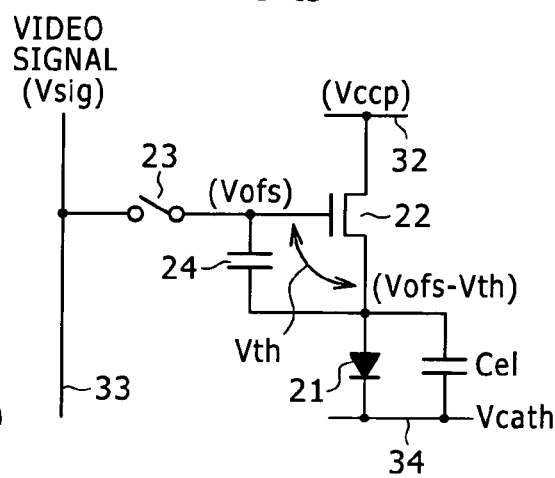
Figure 6C:
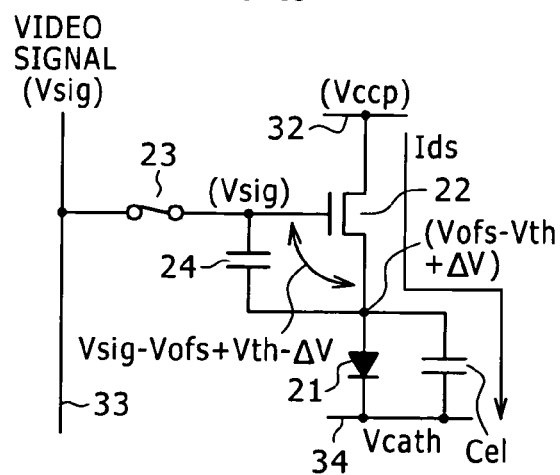

Next, at time t5, as shown in FIG. 6B, the potential of the signal line 33 is changed from the reference potential Vofs to the signal voltage Vsig of the video signal. Then, at time t6, the potential WS of the scanning line 31 makes a transition to the high potential side. Thereby, as shown in FIG. 6C, the writing transistor 23 is set in a conducting state to sample the signal voltage Vsig of the video signal and write the signal voltage Vsig into the pixel 20.

As a result of the writing of the signal voltage Vsig by the writing transistor 23, the gate potential Vg of the driving transistor 22 becomes the signal voltage Vsig. At a time of driving the driving transistor 22 by the signal voltage Vsig of the video signal, the threshold voltage Vth of the driving transistor 22 is cancelled out by the voltage retained by the storage capacitor 24 and corresponding to the threshold voltage Vth, whereby threshold value correction is performed. Details of principles of the threshold value correction will be described later.

At this time, the organic EL element 21 is first in a cutoff state (state of high impedance). Thus, a current (drain-to-source current Ids) flowing from the power supply line 32 to the driving transistor 22 according to the signal voltage Vsig of the video signal flows into the equivalent capacitance Cel of the organic EL element 21. Thus, the charging of the equivalent capacitance Cel is started.

The charging of the equivalent capacitance Cel raises the source potential Vs of the driving transistor 22 with the passage of time. At this time, a variation in the threshold voltage Vth of the driving transistor 22 in each pixel is already corrected, and the drain-to-source current Ids of the driving transistor 22 is dependent on mobility μ of the driving transistor 22.

Supposing that in this case, a ratio of the voltage Vgs retained by the storage capacitor 24 to the signal voltage Vsig of the video signal, that is, a writing gain is one (ideal value), the source potential Vs of the driving transistor 22 rises to a potential Vofs−Vth+ΔV, whereby the gate-to-source voltage Vgs of the driving transistor 22 is Vsig−Vofs+Vth−ΔV.

That is, the rise ΔV in the source potential Vs of the driving transistor 22 is subtracted from the voltage (Vsig−Vofs+Vth) retained by the storage capacitor 24, or in other words, the rise ΔV in the source potential Vs of the driving transistor 22 acts to discharge the charge stored in the storage capacitor 24, so that a negative feedback is applied. Thus, the rise ΔV in the source potential Vs is a feedback amount of the negative feedback.

By thus applying a negative feedback to the gate input side of the driving transistor 22, that is, the gate-to-source voltage Vgs by the feedback amount ΔV corresponding to the drain-to-source current Ids flowing through the driving transistor 22, mobility correction that cancels out the dependence of the drain-to-source current Ids of the driving transistor 22 on mobility μ, that is, corrects a variation in mobility μ in each pixel is performed.

More specifically, the higher the signal amplitude Vin (=Vsig−Vofs) of the video signal written to the gate electrode of the driving transistor 22, the larger the drain-to-source current Ids, and thus the greater the absolute value of the feedback amount ΔV of the negative feedback. Therefore, the mobility correction is performed according to light emission luminance level.

In addition, when the signal amplitude Vin of the video signal is fixed, the higher the mobility μ of the driving transistor 22, the greater the absolute value of the feedback amount ΔV of the negative feedback, so that a variation in mobility μ in each pixel can be eliminated. Therefore, the feedback amount ΔV of the negative feedback can also be said to be a correction amount of mobility correction. Details of principles of the mobility correction will be described later.

<Emission Period>

Figure 6D:
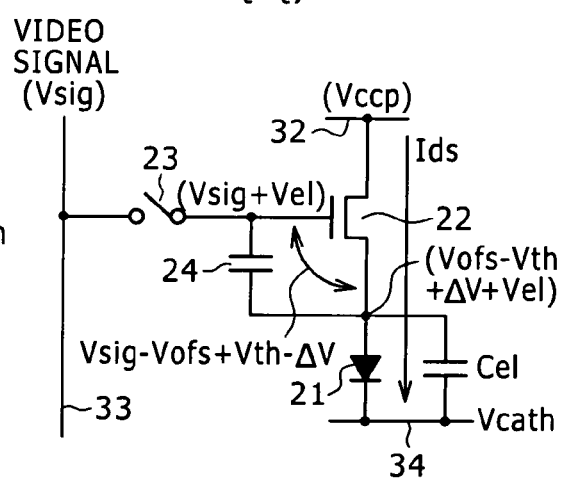

Next, the potential WS of the scanning line 31 makes a transition to the low potential side at time t7, whereby the writing transistor 23 is set in a non-conducting state as shown in FIG. 6D. Thereby, the gate electrode of the driving transistor 22 is electrically disconnected from the signal line 33, and is thus set in a floating state.

When the gate electrode of the driving transistor 22 is in a floating state and the source potential Vs of the driving transistor 22 varies, the gate potential Vg of the driving transistor 22 also varies in such a manner as to be interlocked with (follow) the variation in the source potential Vs because the storage capacitor 24 is connected between the gate and the source of the driving transistor 22. The operation of the gate potential Vg of the driving transistor 22 thus varying in such a manner as to be interlocked with variation in the source potential Vs of the driving transistor 22 is a bootstrap operation by the storage capacitor 24.

The gate electrode of the driving transistor 22 is set in a floating state, and at the same time, the drain-to-source current Ids of the driving transistor 22 starts to flow to the organic EL element 21. Thereby, the anode potential of the organic EL element 21 rises according to the drain-to-source current Ids of the driving transistor 22.

When the anode potential of the organic EL element 21 exceeds Vthel+Vcath, the driving current (light emission current) starts flowing through the organic EL element 21, and therefore the organic EL element 21 starts emitting light. A rise in the anode potential of the organic EL element 21 is none other than a rise in the source potential Vs of the driving transistor 22. When the source potential Vs of the driving transistor 22 rises, the gate potential Vg of the driving transistor 22 is also raised in an interlocked manner by the bootstrap operation of the storage capacitor 24.

At this time, supposing that a bootstrap gain is one (ideal value), the amount of the rise in the gate potential Vg is equal to the amount of the rise in the source potential Vs. Therefore, the gate-to-source voltage Vgs of the driving transistor 22 during the emission period is maintained at a fixed level Vsig−Vofs+Vth−ΔV. Then, at time t8, the potential of the signal line 33 is changed from the signal voltage Vsig of the video signal to the reference potential Vofs.

The respective process operations of the threshold value correction preparation, the threshold value correction, the writing of the signal voltage Vsig (signal writing), and the mobility correction in the series of circuit operations described above are performed in one horizontal scanning period (1H). The respective process operations of the signal writing and the mobility correction are performed in parallel with each other in a period from time t6 to time t7.

Incidentally, while the above description has been made by taking as an example a driving method that performs the threshold value correcting process only once, this driving method is a mere example. For example, a driving method can be adopted which performs a so-called divided Vth correction, in which the threshold value correcting process is divided and performed a plurality of times in not only one horizontal scanning period in which the threshold value correcting process is performed together with the mobility correcting and signal writing process but also a plurality of horizontal scanning periods preceding the one horizontal scanning period.

By thus adopting the driving method that performs the threshold value correcting process a plurality of times in a divided manner in one horizontal scanning period in which mobility correction and signal writing are performed and a plurality of horizontal scanning periods preceding the one horizontal scanning period, a sufficient time can be secured as threshold value correcting period even when a time assigned to one horizontal scanning period is shortened due to an increase in the number of pixels which increase is involved in achieving higher definition. Therefore, the threshold value correcting process can be performed surely.

(Principles of Threshold Value Correction)

Principles of threshold value correction of the driving transistor 22 will be described in the following. The driving transistor 22 is designed to operate in a saturation region, and thus operates as a constant-current source. Thereby, a constant drain-to-source current (driving current) Ids given by the following Equation (1) is supplied from the driving transistor 22 to the organic EL element 21.

$$Ids=(½)·\mu(W/L)Cox(Vgs-Vth)^2 \quad (1)$$

where W is the channel width of the driving transistor 22, L is the channel length of the driving transistor 22, and Cox is gate capacitance per unit area.

Figure 7:
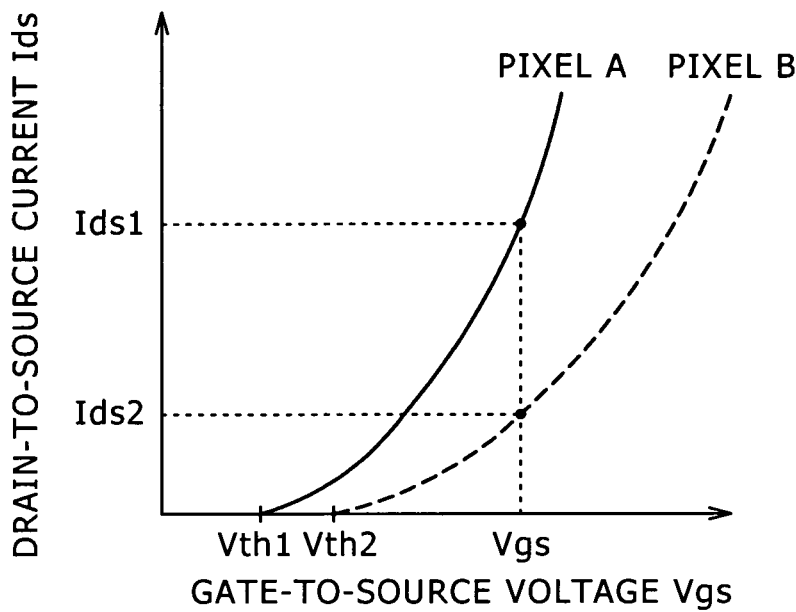
FIG. 7 is a characteristic diagram of assistance in explaining a problem caused by variations in threshold voltage Vth of driving transistors.

FIG. 7 shows a characteristic of the drain-to-source current Ids of the driving transistor 22 versus the gate-to-source voltage Vgs of the driving transistor 22.

As shown in this characteristic diagram, without variation in the threshold voltage Vth of the driving transistor 22 in each pixel being corrected, when the threshold voltage Vth is Vth1, the drain-to-source current Ids corresponding to the gate-to-source voltage Vgs is Ids1.

On the other hand, when the threshold voltage Vth is Vth2 (Vth2>Vth1), the drain-to-source current Ids corresponding to the same gate-to-source voltage Vgs is Ids2 (Ids2<Ids1). That is, when the threshold voltage Vth of the driving transistor 22 varies, the drain-to-source current Ids varies even if the gate-to-source voltage Vgs is constant.

On the other hand, in the pixel (pixel circuit) 20 of the above-described configuration, the gate-to-source voltage Vgs of the driving transistor 22 at the time of light emission is Vsig−Vofs+Vth−ΔV, as described above. Thus, when this is substituted into Equation (1), the drain-to-source current Ids is expressed by the following Equation (2).

$$Ids=(½)·\mu(W/L)Cox(Vsig-Vofs-\Delta V)^2 \quad (2)$$

That is, the term of the threshold voltage Vth of the driving transistor 22 is cancelled, and therefore the drain-to-source current Ids supplied from the driving transistor 22 to the organic EL element 21 is not dependent on the threshold voltage Vth of the driving transistor 22. As a result, even when the threshold voltage Vth of the driving transistor 22 varies in each pixel due to variations in a process of manufacturing the driving transistor 22 or a secular change in the driving transistor 22, the drain-to-source current Ids does not vary. Therefore, the light emission luminance of the organic EL element 21 can be held constant.

(Principles of Mobility Correction)

Figure 8:
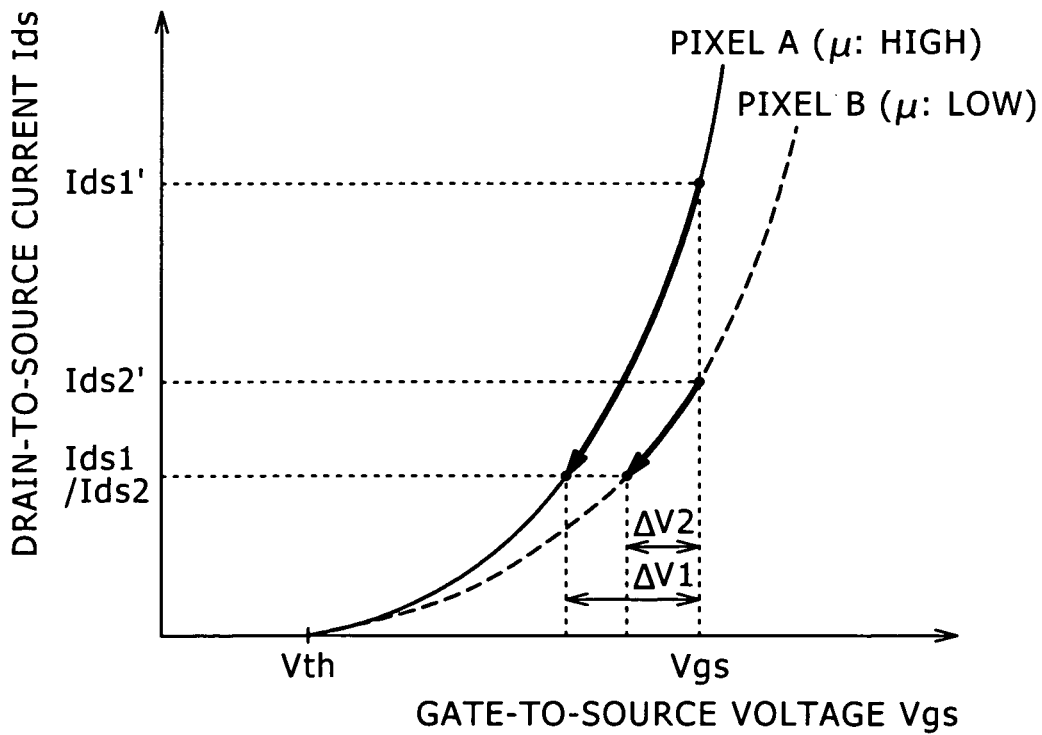
FIG. 8 is a characteristic diagram of assistance in explaining a problem caused by variations in mobility µ of driving transistors.

Principles of the mobility correction of the driving transistor 22 will next be described. FIG. 8 shows characteristic curves in a state in which a pixel A whose driving transistor 22 has a relatively high mobility μ and a pixel B whose driving transistor 22 has a relatively low mobility μ are compared with each other. When the driving transistor 22 is formed by a polysilicon thin film transistor or the like, the mobility μ inevitably varies between pixels such as the pixel A and the pixel B.

In a case where for example both pixels A and B have a signal amplitude Vin (=Vsig−Vofs) at a same level written to the gate electrodes of the driving transistors 22 with the mobility μ varying between the pixel A and the pixel B, when no correction is made for the mobility μ, a large difference occurs between a drain-to-source current Ids1′ flowing in the pixel A of high mobility μ and a drain-to-source current Ids2′ flowing in the pixel B of low mobility μ. A large difference in drain-to-source current Ids thus occurring between pixels due to a variation in mobility μ in each pixel impairs the uniformity of the screen.

As is clear from the above-described Equation (1) as a transistor characteristic equation, when the mobility μ is high, the drain-to-source current Ids is increased. Hence, the higher the mobility μ, the larger the feedback amount ΔV of negative feedback. As shown in FIG. 8, the feedback amount ΔV1 of the pixel A of high mobility μ is larger than the feedback amount ΔV2 of the pixel B of low mobility.

Accordingly, the mobility correcting process applies a negative feedback to the gate input side of the driving transistor 22, that is, the gate-to-source voltage Vgs by a feedback amount ΔV corresponding to the drain-to-source current Ids of the driving transistor 22. Thereby, a larger amount of negative feedback is applied as the mobility μ is increased. As a result, variations in mobility μ in each pixel can be suppressed.

Specifically, when a correction of the feedback amount ΔV1 is applied in the pixel A of high mobility μ, the drain-to-source current Ids falls greatly from Ids1′ to Ids1. On the other hand, because the feedback amount ΔV2 of the pixel B of low mobility μ is small, the drain-to-source current Ids falls from Ids2′ to Ids2, and thus does not fall so greatly. Consequently, the drain-to-source current Ids1 of the pixel A and the drain-to-source current Ids2 of the pixel B become substantially equal to each other. Therefore, variations in mobility μ in each pixel are corrected.

Summarizing the above, when there are a pixel A and a pixel B of different mobilities μ, the feedback amount ΔV1 of the pixel A of high mobility μ is larger than the feedback amount ΔV2 of the pixel B of low mobility μ. That is, the higher the mobility μ of a pixel, the larger the feedback amount ΔV, and the larger the amount of decrease in drain-to-source current Ids.

Thus, by applying a negative feedback to the gate input side of the driving transistor 22, that is, the gate-to-source voltage Vgs by a feedback amount ΔV corresponding to the drain-to-source current Ids of the driving transistor 22, the current values of drain-to-source currents Ids in pixels of different mobilities μ are uniformized. As a result, variations in mobility μ in each pixel can be corrected. That is, the process of applying a negative feedback to the gate input side of the driving transistor 22 by a feedback amount ΔV corresponding to the current (drain-to-source current Ids) flowing through the driving transistor 22 is the mobility correcting process.

Relations between the signal potential (sampling potential) Vsig of the video signal and the drain-to-source current Ids of the driving transistor 22 according to whether threshold value correction and mobility correction are performed or not in the pixel (pixel circuit) 20 shown in FIG. 2 will be described in the following with reference to FIGS. 9A, 9B, and 9C.

Figure 9A:
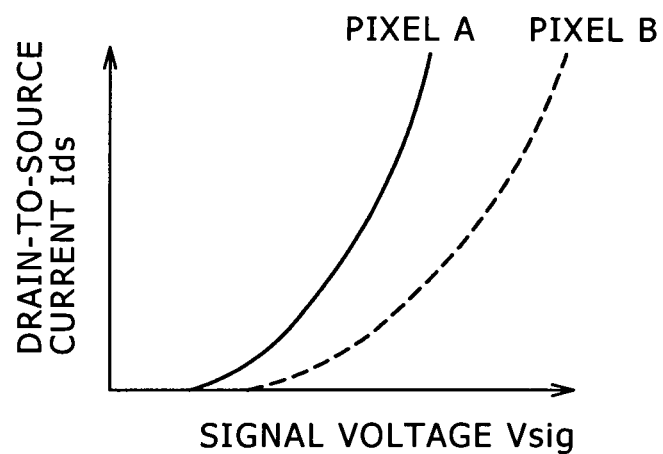
FIGS. 9A, 9B, and 9C are characteristic diagrams of assistance in explaining relations between the signal voltage Vsig of a video signal and the drain-to-source current Ids of a driving transistor according to whether threshold value correction and mobility correction are performed or not.

FIG. 9A represents a case where neither threshold value correction nor mobility correction is performed; FIG. 9B represents a case where mobility correction is not performed and only threshold value correction is performed; and FIG. 9C represents a case where threshold value correction and mobility correction are both performed. As shown in FIG. 9A, when neither threshold value correction nor mobility correction is performed, variations in threshold voltage Vth and mobility μ in the pixels A and B cause a large difference in drain-to-source current Ids between the pixels A and B.

Figure 9B:
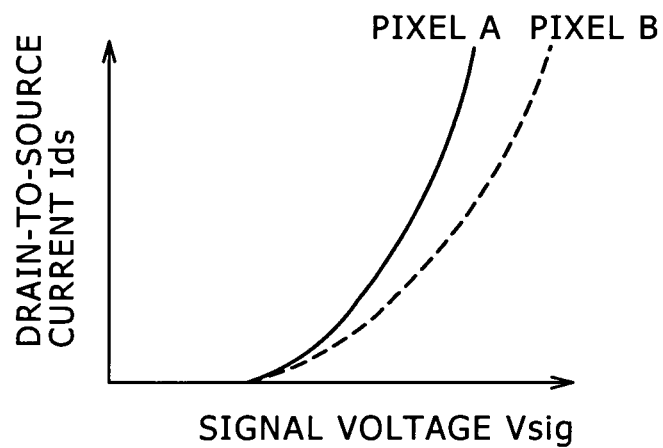

On the other hand, when only threshold value correction is performed, as shown in FIG. 9B, variations in drain-to-source current Ids can be reduced by the threshold value correction to some extent, but a difference in drain-to-source current Ids between the pixels A and B due to variations in mobility μ in the pixels A and B remains.

Figure 9C:
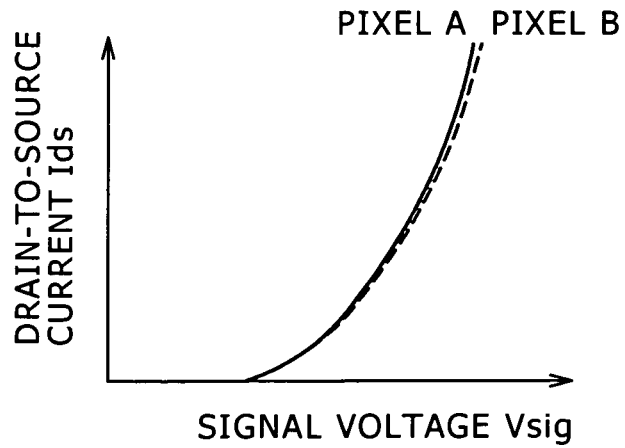

By performing both threshold value correction and mobility correction, as shown in FIG. 9C, a difference in drain-to-source current Ids between the pixels A and B due to variations in threshold voltage Vth and mobility μ in the pixels A and B can be substantially eliminated. Thus, no variations in luminance of the organic EL element 21 occur at any gradation, so that a display image of excellent quality can be obtained.

In addition, the pixel 20 shown in FIG. 2 can provide the following action and effect by having the function of bootstrap operation by the storage capacitor 24 as described above in addition to the respective correcting functions of threshold value correction and mobility correction.

Even when the I-V characteristic of the organic EL element 21 changes with the passage of time, and the source potential Vs of the driving transistor 22 is changed with the secular change in the I-V characteristic of the organic EL element 21, the gate-to-source voltage Vgs of the driving transistor 22 can be held constant by the bootstrap operation of the storage capacitor 24. Therefore, the current flowing through the organic EL element 21 is unchanged and constant. As a result, the light emission luminance of the organic EL element 21 is also held constant. Thus, even when a secular change in I-V characteristic of the organic EL element 21 occurs, image display without luminance degradation attendant on the secular change in I-V characteristic of the organic EL element 21 can be achieved.

[Problems of Scanning Driving System]

In the above-described organic EL display device 10 as a premise of the present invention, output stages of each of the writing scanning circuit 40 and the power supply scanning circuit 50 as drivers of the scanning driving system are associated in one-to-one relation with the control lines (the scanning lines 31-1 to 31-m and the power supply lines 32-1 to 32-m) of the control line group. That is, each of the writing scanning circuit 40 and the power supply scanning circuit 50 has output stages the number of which is the same as the number m of lines (number of rows) of the pixel array section 30.

As an example, when the drivers are formed by a shift register, an output stage of the drivers (the writing scanning circuit 40 and the power supply scanning circuit 50 in the present example) of the scanning driving system are composed of a unit circuit (shift stage/transfer stage) of the shift register, a logic circuit provided in correspondence with the unit circuit, and the like. A level shift circuit may be provided as required in addition to the logic circuit.

In a case where the output stages of the drivers of the scanning driving system and the control lines of the control line group are thus associated in one-to-one relation with each other, and for the plurality of control lines such as the scanning lines 31-1 to 31-m and the power supply lines 32-1 to 32-m arranged in each line, the number of output stages of each driver of the scanning driving system is set equal to the number m of lines, when the number of lines is increased as the display device has higher definition, the number of output stages of each driver of the scanning driving system is increased with the increase in the number of lines, and the circuit scale of the scanning driving system becomes larger by an amount corresponding to the increase in the number of output stages of each driver of the scanning driving system. Thus, a panel module including the scanning driving system is increased in size.

When the number of output stages of the writing scanning circuit 40 and the power supply scanning circuit 50 can be reduced regardless of whether the number of lines of the pixel array section 30 is increased or not, the circuit scale of the scanning driving system is decreased by an amount corresponding to the reduction of the number of output stages, and an area occupied by the circuit part of the scanning driving system can be reduced. This is advantageous in reducing the size of the panel module.

[Characteristic Parts of Present Embodiment]

Figure 10:
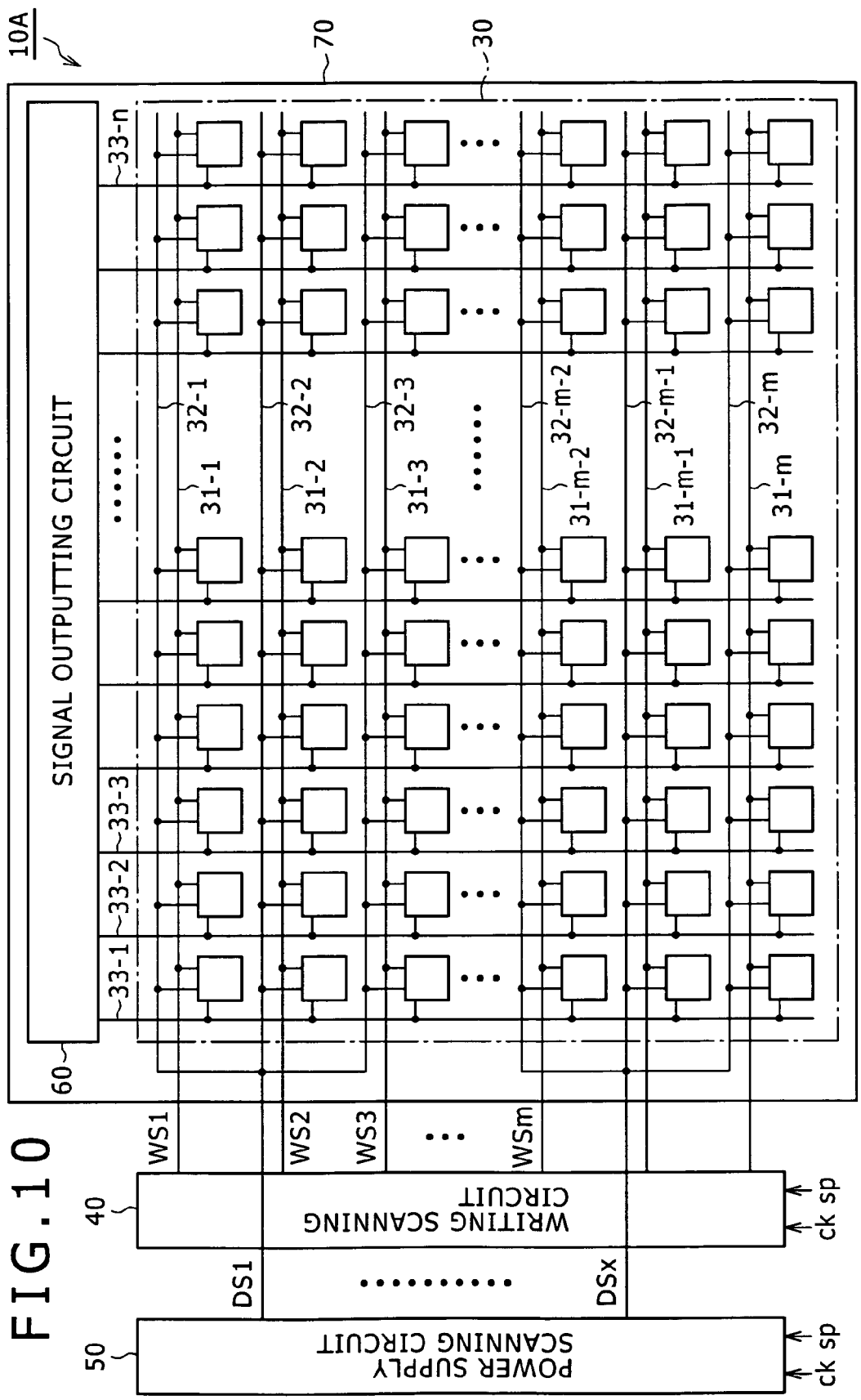
FIG. 10 is a system configuration diagram showing an outline of a configuration of an organic EL display device according to an embodiment of the present invention.

From the above-described viewpoint, as shown in FIG. 10, an organic EL display device 10A according to one embodiment of the present invention has a constitution in which the output stages of a power supply scanning circuit 50, for example, are associated in one-to-X (X is two or more, and is the number m of lines divided by an integer) relation with power supply lines 32-1 to 32-m for the purpose of reducing the output stages of drivers of the scanning driving system. In this case, X=3 as an example. That is, the driving timing of a power supply line 32 for three lines is made common.

More specifically, a writing scanning circuit 40 has output stages whose number is the number m of lines, and scanning signals WS1 to WSm sequentially output from the respective output stages are supplied to scanning lines 31-1 to 31-m in units of one line, whereas the power supply scanning circuit 50 has output stages whose number is m/3, and power supply line potentials DS1 to DSx (x=m/3) sequentially output from the respective output stages are supplied to the power supply lines 32 in units of three lines.

Thus, while the output stages of the writing scanning circuit 40 are provided by the number m of rows of a pixel array section 30, the output stages of the power supply scanning circuit 50 are reduced to 1/X, or ⅓ in the present example, of the total number m of rows of the pixel array section 30. Thereby, the circuit scale of the power supply scanning circuit 50 can be reduced greatly, or to about ⅓ in the present example, as compared with a case of the output stages of the power supply scanning circuit 50 being provided by the number m of lines. Thus, the circuit scale of the scanning driving system as a whole can be correspondingly reduced, and therefore the size of the panel module can be reduced.

The panel module refers to a module including a display panel 70 where the pixel array section 30 and a signal outputting circuit 60 are formed, an external circuit board provided outside the display panel 70 and on which the writing scanning circuit 40 and the power supply scanning circuit 50 and the like are formed, means for electric connection between the external circuit board and the display panel 70, and the like.

Circuit Operation of Organic EL Display Device according to Present Embodiment

The circuit operation of the organic EL display device 10A according to the present embodiment will next be described with reference to timing waveform charts of FIG. 11 and FIG. 12. While description in the following will be made by taking as an example a case of adopting the driving method that performs the threshold value correcting process only once, the present embodiment is not limited to application to this driving method, and is similarly applicable to the driving method that performs the above-described divided Vth correction.

Figure 11:
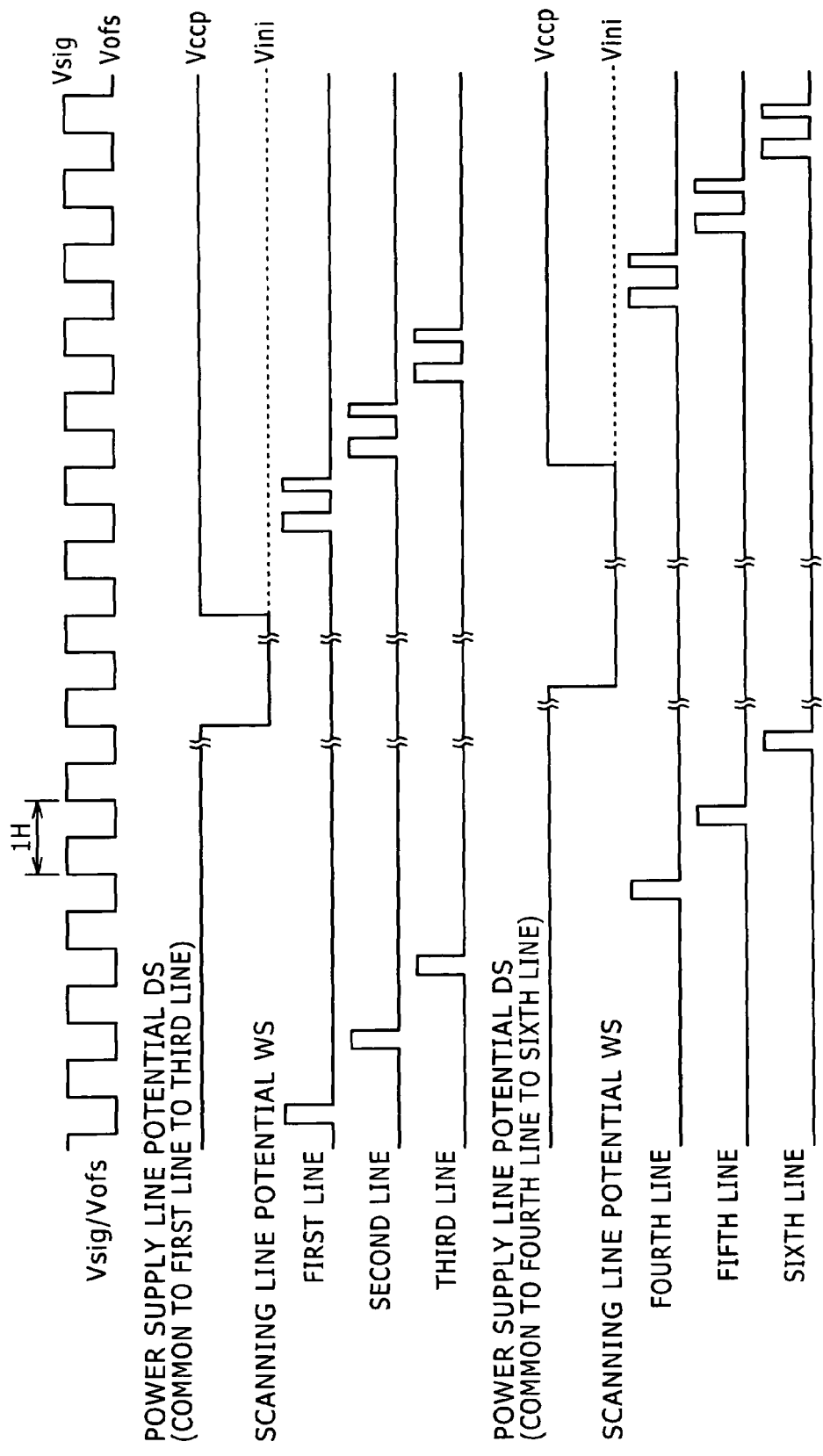
FIG. 11 is a timing waveform chart (1) of assistance in explaining the circuit operation of the organic EL display device according to the present embodiment.

FIG. 11 shows, as an example, a timing relation between the potential (Vsig/Vofs) of a signal line 33 and the potentials (scanning signals) WS of scanning lines 31 and the potentials DS of power supply lines 32 for a first line to a sixth line when the driving timing of a power supply line 32 for three lines is made common.

As is clear from the timing waveform chart of FIG. 11, scanning signals (scanning line potentials) WS are sequentially output from the writing scanning circuit 40 in units of one line in order of the first line, the second line, the third line, the fourth line, ..., while power supply line potentials DS are sequentially output from the power supply scanning circuit 50 in units of three lines. Incidentally, the scanning signals (scanning line potentials) WS are different than in the above-described basic circuit operation in that the scanning signals (scanning line potentials) WS are once set in an active state (high-potential state) before the power supply line potentials DS change from a high potential Vccp to a low potential Vini. Reasons for this will be described later.

Figure 12:
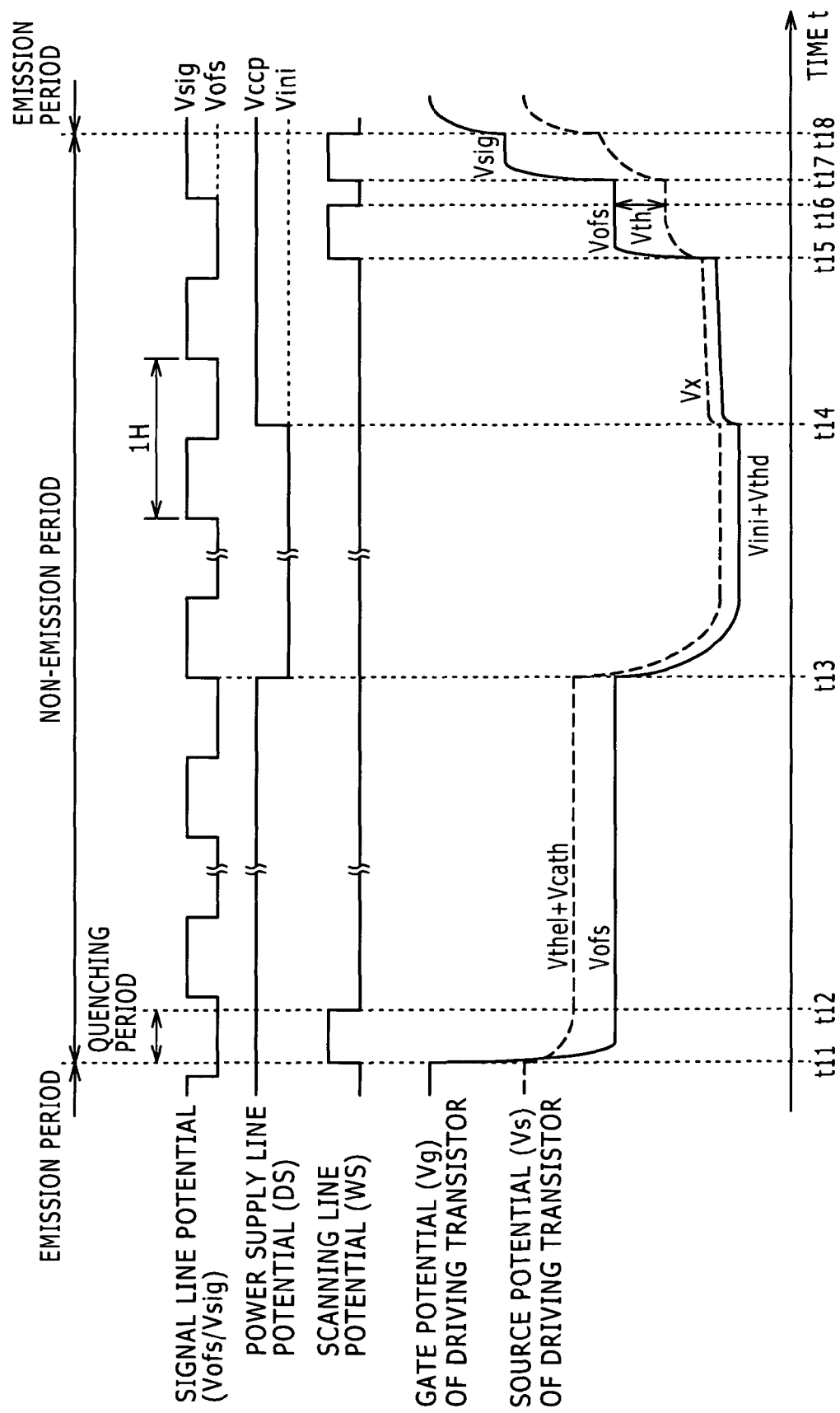
FIG. 12 is a timing waveform chart (2) of assistance in explaining the circuit operation of the organic EL display device according to the present embodiment.

FIG. 12 shows changes in the potential WS of a scanning line 31-1 and the potential DS of a power supply line 32-1 for a certain line, for example the first line, and changes in the gate potential Vg and the source potential Vs of a driving transistor 22.

The circuit operation of the organic EL display device 10A according to the present embodiment will be described in the following with reference to operation explanatory diagrams of FIGS. 13A, 13B, 13C, and 13D and FIGS. 14A, 14B, 14C, and 14D on the basis of the timing waveform chart of FIG. 12. Incidentally, in the operation explanatory diagrams of FIGS. 13A to 13D and FIGS. 14A to 14D, a writing transistor 23 is represented by the symbol of a switch in order to simplify the drawings.

<Emission Period of Preceding Frame>

Figure 13A:
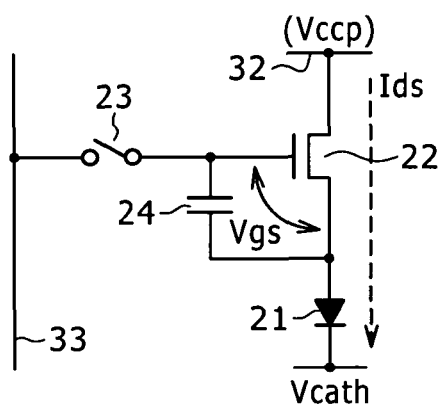
FIGS. 13A, 13B, 13C, and 13D are operation explanatory diagrams (1) of the circuit operation of the organic EL display device according to the present embodiment.

A period before time t11 in the timing waveform chart of FIG. 12 is an emission period of an organic EL element 21 in a preceding frame (field). In the emission period of the preceding frame, the potential DS of the power supply line 32 is a high potential Vccp, and as shown in FIG. 13A, the writing transistor 23 is in a non-conducting state.

The driving transistor 22 is designed to operate in the saturation region at this time. Thereby, a driving current Ids (see the above-described Equation (1)) corresponding to the gate-to-source voltage Vgs of the driving transistor 22 is supplied from the power supply line 32 through the driving transistor 22 to the organic EL element 21. The organic EL element 21 thus emits light at a luminance corresponding to the current value of the driving current Ids.

<Quenching Period>

Figure 13B:
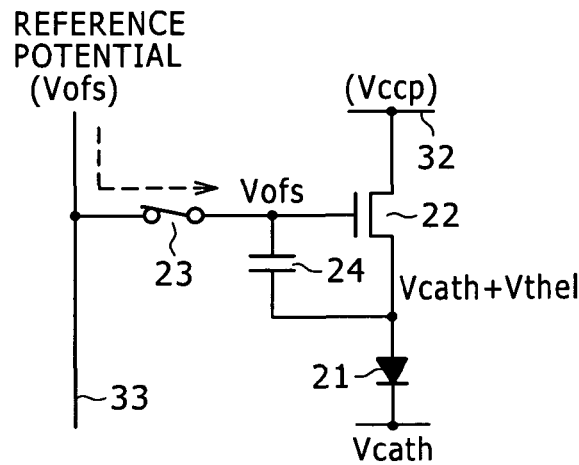

A new frame (present frame) of line-sequential scanning begins at time t11 in a period in which the potential of a signal line 33 is a reference potential Vofs. When the potential WS of the scanning line 31 makes a transition from a low potential side to a high potential side at time t11, as shown in FIG. 13B, the writing transistor 23 is set in a conducting state, so that the reference potential Vofs is written to the gate electrode of the driving transistor 22.

Thereby, the gate-to-source voltage Vgs of the driving transistor 22 becomes less than the threshold voltage Vth of the driving transistor 22. Therefore, the driving current Ids ceases to flow to the organic EL element 21, and the organic EL element 21 is quenched, so that a non-emission period begins. At this time, a voltage Vel applied to the organic EL element 21 is the threshold voltage Vthel of the organic EL element 21, and thus the anode potential of the organic EL element 21 is a sum of the threshold voltage Vthel and the cathode potential Vcath of the organic EL element 21 (Vthel+Vcath).

<Non-Emission Period>

Figure 13C:
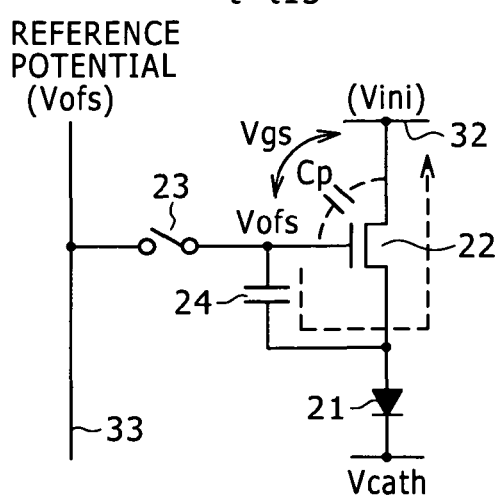

In the non-emission period, the potential WS of the scanning line 31 makes a transition from a high potential side to a low potential side at time t12, and the potential DS of the power supply line 32 changes from the high potential Vccp to the low potential Vini at time t13 after the passage of a certain time from time t12. At this time, the electrode on the power supply line 32 side of the driving transistor 22 becomes a source electrode, and thus a current flows from the anode side of the organic EL element 21 to the power supply line 32 side, as shown in FIG. 13C. Thereby, the anode potential of the organic EL element 21 decreases with the passage of time.

At this time, because the writing transistor 23 is in the non-conducting state, the gate potential Vg of the driving transistor 22 also decreases with the passage of time in such a manner as to be interlocked with the anode potential of the organic EL element 21. That is, the gate-to-source voltage Vgs of the driving transistor 22, or a voltage between the gate electrode of the driving transistor 22 and the power supply line 32, decreases with the passage of time.

At this time, when the driving transistor 22 operates in a saturation region, that is, when Vgs−Vthd≦Vds, as shown in FIG. 13C, a parasitic capacitance Cp occurs between the gate and the source of the driving transistor 22. In this case, Vthd is a threshold voltage between the gate of the driving transistor 22 and the power supply (power supply line 32). At this time, an amount of decrease in the gate potential Vg of the driving transistor 22 is a result of multiplying an amount of decrease in the anode potential of the organic EL element 21 by a certain ratio.

Figure 13D:
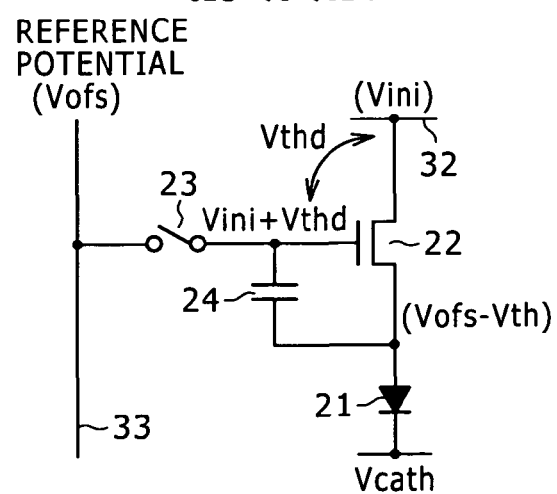

That is, because of the parasitic capacitance Cp, the amount of decrease in the anode potential is larger than the amount of decrease in the gate potential Vg. At this time, when the driving transistor 22 continues operating in the saturation region, as shown in FIG. 13D, the gate potential Vg of the driving transistor 22 becomes Vini+Vthd after the passage of a certain time.

Figure 14A:
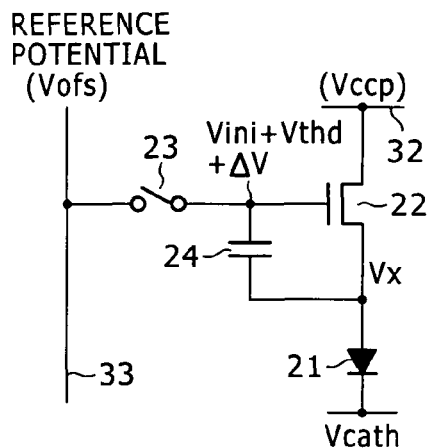
FIGS. 14A, 14B, 14C, and 14D are operation explanatory diagrams (2) of the circuit operation of the organic EL display device according to the present embodiment.

Next, at time t14 after the passage of a certain time from time t13, as shown in FIG. 14A, the potential DS of the power supply line 32 changes from the low potential Vini to the high potential Vccp again. At this time, in FIG. 14A, an amount of coupling by the parasitic capacitance Cp which amount is input to the gate electrode of the driving transistor 22 is ΔV, and the anode potential of the organic EL element 21 is Vx.

Because the potential DS of the power supply line 32 changes to the high potential Vccp, the source electrode of the driving transistor 22 is on the side of the anode electrode of the organic EL element 21, and a current flows from the power supply line 32 to the anode electrode of the organic EL element 21 due to the gate-to-source voltage Vgs of the driving transistor 22, that is, a voltage between the gate electrode of the driving transistor 22 and the anode electrode of the organic EL element 21. At this time, when the gate-to-source voltage Vgs of the driving transistor 22 is smaller than the threshold voltage Vth, the gate potential Vg and the source potential Vs are hardly raised by the current flowing through the driving transistor 22.

<Threshold Value Correcting Period>

At time t15 in a period in which the potential of the signal line 33 is the reference potential Vofs, the potential WS of the scanning line 31 makes a transition from the low potential side to the high potential side. Thereby, as shown in FIG. 14B, the writing transistor 23 is set in a conducting state, so that the gate potential Vg of the driving transistor 22 becomes the reference potential Vofs.

At this time, an amount of change in the gate potential Vg of the driving transistor 22 is input to the source electrode of the driving transistor 22 at a certain ratio determined by the capacitance value Cs of a storage capacitor 24, a gate-to-source parasitic capacitance Cgs, and the parasitic capacitance Cel of the organic EL element 21. Letting G be the input ratio at this time, the input ratio G is expressed by the following Equation (3).

$$G=(Cs+Cgs)/(Cs+Cgs+Cel) \quad (3)$$

Figure 14B:
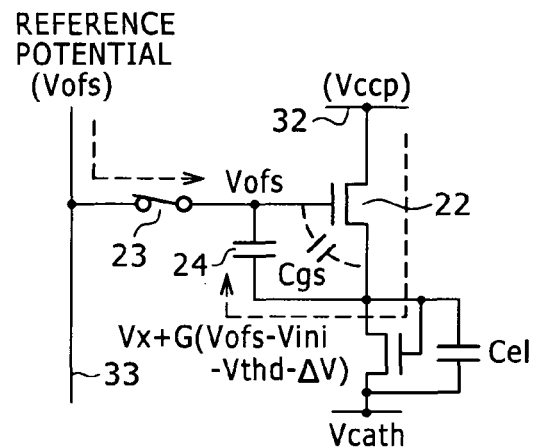

When the gate-to-source voltage Vgs of the driving transistor 22 is larger than the threshold voltage Vth of the driving transistor 22 in this state, a current flows from the power supply line 32 to the driving transistor 22, as shown in FIG. 14B. In other words, the respective values of the reference potential Vofs and the low potential Vini need to be set such that the gate-to-source voltage Vgs of the driving transistor 22 at this time is larger than the threshold voltage Vth of the driving transistor 22.

Figure 15:
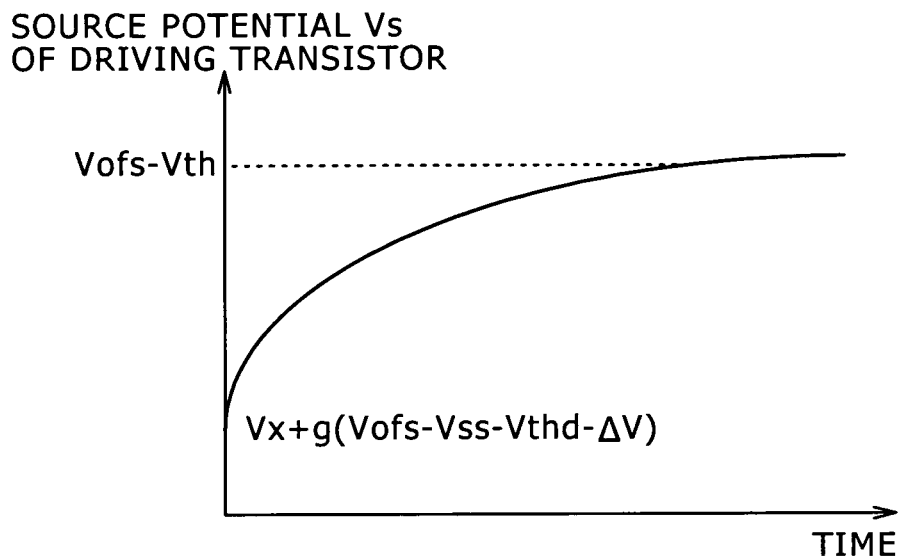
FIG. 15 is a diagram showing change in the source potential Vs of a driving transistor at a time of charging a storage capacitor and the equivalent capacitance of an organic EL element.

In this case, as shown in FIG. 14B, the equivalent circuit of the organic EL element 21 is represented by a diode and a capacitance. Thus, as long as the voltage Vel applied to the organic EL element 21 is Vel<Vcath+Vthel, that is, as long as the leakage current of the organic EL element 21 is sufficiently smaller than the current flowing through the driving transistor 22, the current flowing through the driving transistor 22 is used to charge the storage capacitor 24 and the equivalent capacitance Cel of the organic EL element 21. At this time, as shown in FIG. 15, the source potential Vs of the driving transistor 22 rises with the passage of time.

Then, after the passage of a certain time, the gate-to-source voltage Vgs of the driving transistor 22 converges to the threshold voltage Vth of the driving transistor 22. At this time, the voltage Vel applied to the organic EL element 21 is Vel=Vofs−Vth<Vcath+Vthel. At time t16, the potential WS of the scanning line 31 makes a transition from the high potential side to the low potential side, whereby the writing transistor 23 is set in a non-conducting state, and the threshold value correcting period is ended.

<Signal Writing Period and Mobility Correcting Period>

Figure 14C:
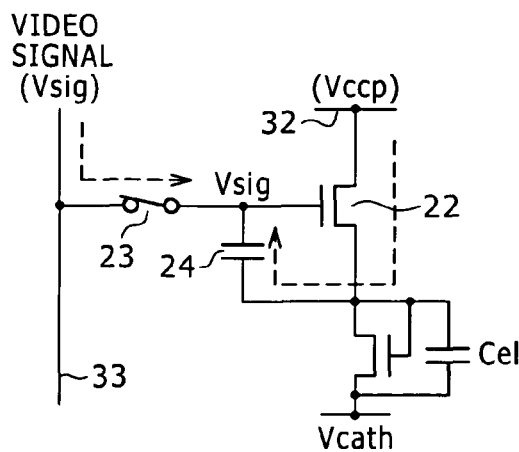

Next, after the potential of the signal line 33 changes from the reference potential Vofs to the signal voltage Vsig of a video signal, as shown in FIG. 14C, the potential WS of the scanning line 31 makes a transition from the low potential side to the high potential side at time t17. Thereby, the writing transistor 23 is set in the conducting state again. The signal voltage Vsig is a voltage corresponding to a gradation.

Because the writing transistor 23 is in the conducting state, the gate potential Vg of the driving transistor 22 becomes the signal voltage Vsig. Thereby, a current flows from the power supply line 32 to the driving transistor 22. Thus, the source potential Vs rises with the passage of time.

At this time, when the source potential Vs of the driving transistor 22 does not exceed the sum of the threshold voltage Vthel and the cathode potential Vcath of the organic EL element 21 (Vthel+Vcath), that is, when the leakage current of the organic EL element 21 is sufficiently smaller than the current flowing through the driving transistor 22, the current flowing through the driving transistor 22 is used to charge the storage capacitor 24 and the equivalent capacitance Cel of the organic EL element 21.

At this time, because the process of correcting for the threshold value of the driving transistor 22 is completed, that is, a variation in the threshold voltage Vth of the driving transistor 22 in each pixel is corrected, the current flowing through the driving transistor 22 (drain-to-source current Ids) is dependent on mobility μ of the driving transistor 22.

Figure 16:
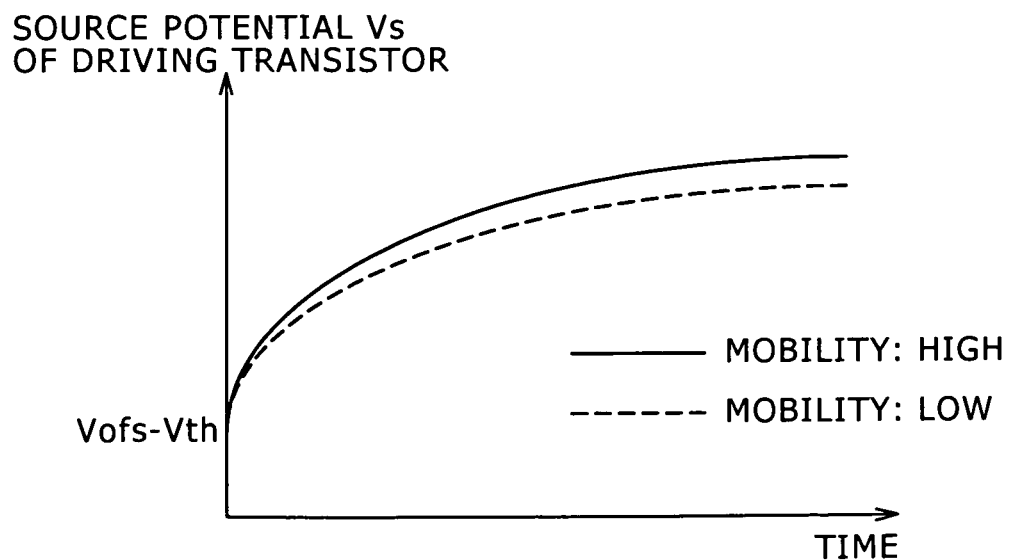
FIG. 16 is a diagram showing changes in the source potential Vs of the driving transistor when the mobility u of the driving transistor is high and low.

Specifically, as shown in FIG. 16, in a pixel in which the mobility μ of the driving transistor 22 is relatively high, a large amount of current flows through the driving transistor 22 at this time, and the source potential Vs rises quickly. Conversely, in a pixel in which the mobility μ of the driving transistor 22 is relatively low, a small amount of current flows through the driving transistor 22 at this time, and the source potential Vs rises slowly. Thereby, the gate-to-source voltage Vgs of the driving transistor 22 is decreased, reflecting the mobility μ of the driving transistor 22, and becomes a voltage Vgs that completely corrects a variation in mobility μ of the driving transistor 22 in each pixel after the passage of a certain time.

<Emission Period>

Figure 14D:
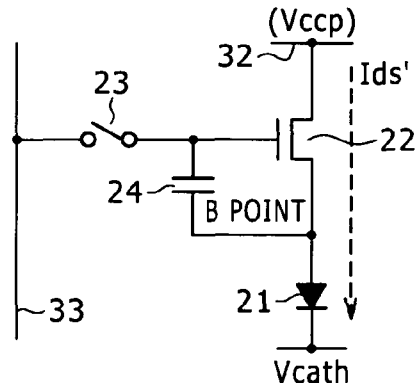

Next, the potential WS of the scanning line 31 makes a transition to the low potential side at time t18. Thereby, as shown in FIG. 14D, the writing transistor 23 is set in the non-conducting state. Because the gate-to-source voltage Vgs of the driving transistor 22 is constant, the driving transistor 22 sends a constant current Ids' to the organic EL element 21. Thereby, the voltage Vel applied to the organic EL element 21 rises to a voltage at which the constant current Ids' flows through the organic EL element 21. As a result, the constant current Ids' flows through the organic EL element 21. Therefore, the organic EL element 21 emits light.

Also in the organic EL display device 10A according to the present embodiment, the I-V characteristic of the organic EL element 21 changes as emission time is lengthened. Therefore, the potential of point B in FIG. 14D, that is, the anode potential of the organic EL element 21 also changes. However, because the gate-to-source voltage Vgs of the driving transistor 22 is maintained at a fixed value, the current flowing through the organic EL element 21 does not change. Hence, even when the I-V characteristic of the organic EL element 21 is degraded, the constant current Ids' continues flowing at all times. Therefore, the luminance of the organic EL element 21 does not change.

(Uniformizing Emission Period between Plurality of Lines)

In making the driving timing of a power supply line 32 for a plurality of lines (for three lines in the present example) common in the organic EL display device 10A according to the present embodiment, as shown in the timing waveform chart of FIG. 11, the scanning line potentials (scanning signals) WS are once set in an active state (high-potential state) in timings different for different lines before the potential DS of the power supply line 32 changes from the high potential Vccp to the low potential Vini. Reasons for this are as follows.

In the basic circuit operation described earlier, as is clear from the timing waveform chart of FIG. 4, the emission period of each pixel row (line) is defined by time t1 at which the potential DS of the power supply line 32 changes from the high potential Vccp to the low potential Vini and time t7 at which the potential (scanning signal) WS of the scanning line 31 makes a transition from the high potential side to the low potential side. In the basic circuit operation, because the potential DS of the power supply line 32 changes from the high potential Vccp to the low potential Vini in each line, the emission period of each line can be uniformized.

On the other hand, in the circuit operation of the organic EL display device 10A according to the present embodiment, because a power supply line 32 is made common to a plurality of lines, time t13 at which the potential DS of the power supply line 32 changes from the high potential Vccp to the low potential Vini is the same timing in the plurality of lines. Thus, when the time t13 is set as emission period ending timing, because the timing of emission period starting time t18 differs in each line, the emission period varies between the plurality of lines.

Accordingly, by once setting the potentials WS of the scanning lines 31 in an active state in timings different for different lines before the potential DS of the power supply line 32 changes from the high potential Vccp to the low potential Vini, the timing of time t11 at which the potentials WS of the scanning lines 31 are activated becomes emission period ending timing. Thus, even when the driving timing of the power supply line 32 for the plurality of lines is made common, the emission period ending timing can be set for each line. It is therefore possible to eliminate variations in emission period between the plurality of lines, and thus uniformize the emission period between the plurality of lines.

(Wiring Layout)

Consideration will now be given to the wiring layout of a power supply line 32 when the driving timing of the power supply line 32 is made common to a plurality of lines.

Figure 17:
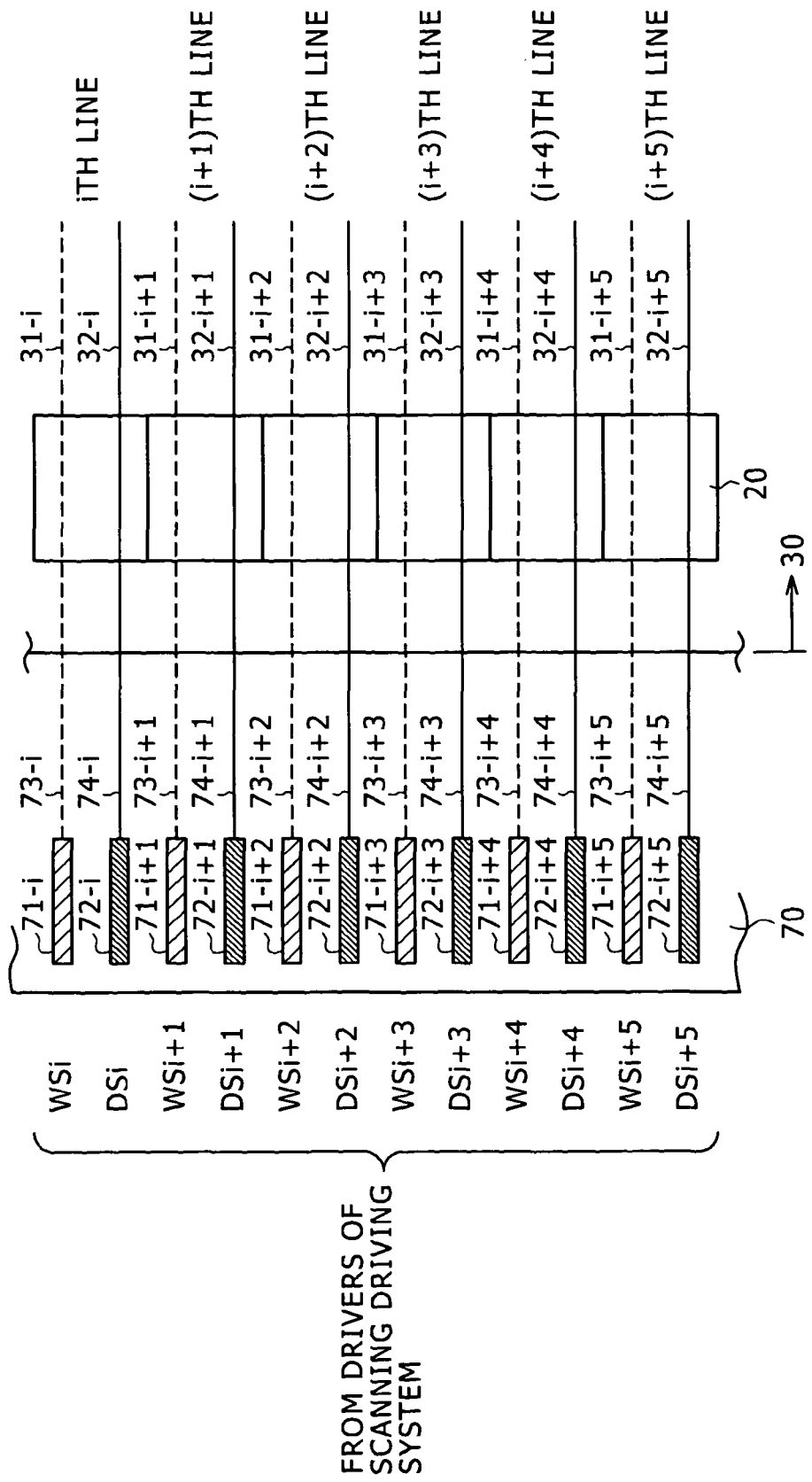
FIG. 17 is a diagram showing a layout structure of wiring in a case where the output stages of a writing scanning circuit and a power supply scanning circuit are provided by the number of rows of a pixel array section.

Consideration will first be given to a case where the output stages of the writing scanning circuit 40 and the power supply scanning circuit 50 are provided by the number of rows of the pixel array section 30. In this case, as shown in FIG. 17, terminals (pins) 71 (71-$i$ to 71-$i$+5 in the figure) and terminals 72 (72-$i$ to 72-$i$+5 in the figure) are provided in one end part in a left-to-right direction of the display panel 70 so as to correspond to scanning lines 31 (31-$i$ to 31-$i$+5 in the figure) and power supply lines 32 (32-$i$ to 32-$i$+5 in the figure) arranged in each line (pixel row).

The scanning lines 31-$i$ to 31-$i$+5 and the terminals 71-$i$ to 71-$i$+5 and the power supply lines 32-$i$ to 32-$i$+5 and the terminals 72-$i$ to 72-$i$+5 are electrically connected to each other in one-to-one relation by pieces of wiring 73-$i$ to 73-$i$+5 and pieces of wiring 74-$i$ to 74-$i$+5, respectively. Thereby, the pieces of wiring 73-$i$ to 73-$i$+5 do not cross the pieces of wiring 74-$i$ to 74-$i$+5, and thus a short circuit attendant on wiring crossing does not occur either.

Figure 18:
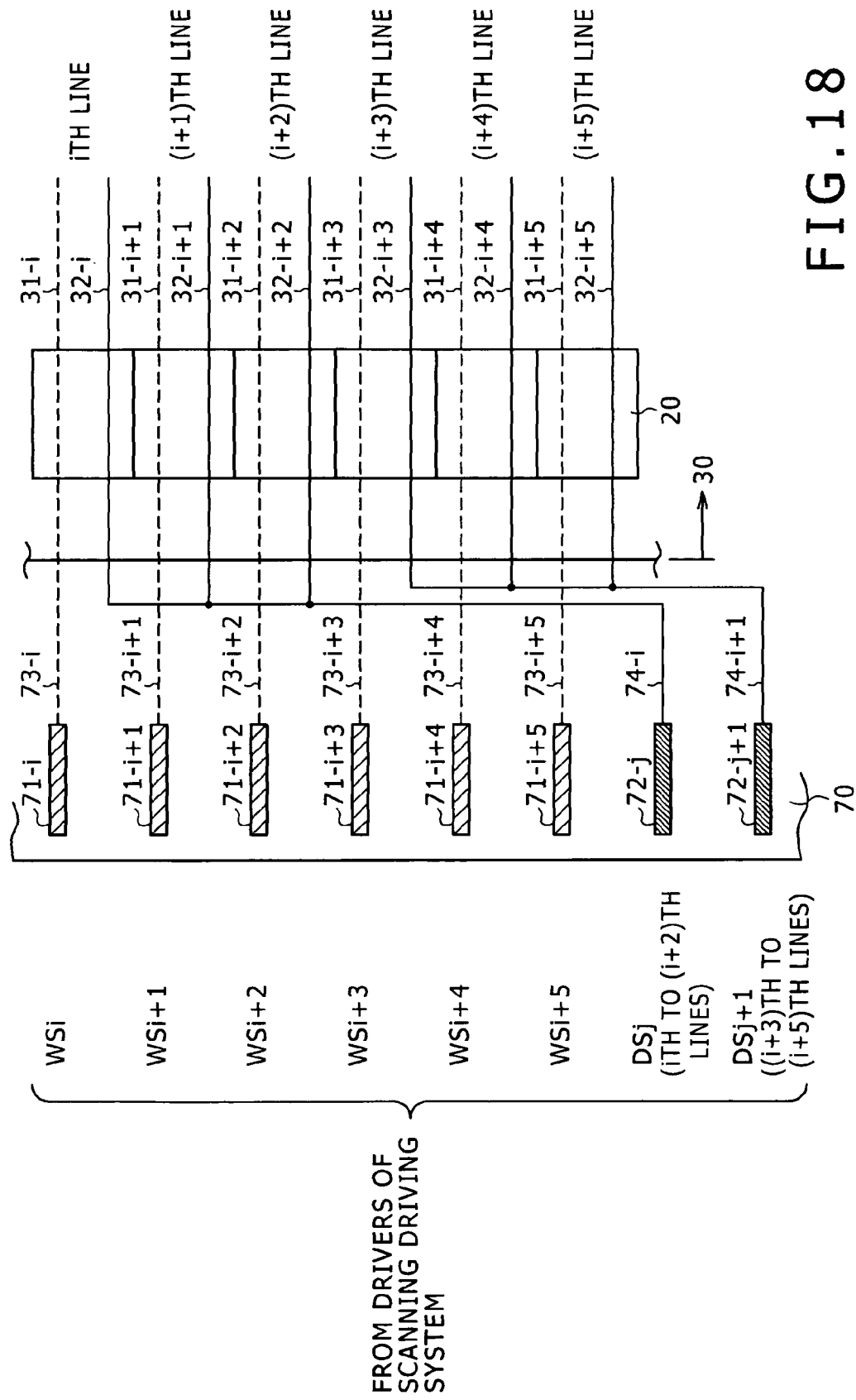
FIG. 18 is a diagram of assistance in explaining a problem when the driving timing of power supply lines is made common to a plurality of lines.

On the other hand, as in the organic EL display device 10A according to the present embodiment, when the driving timing of one of a scanning line 31 and a power supply line 32, for example a power supply line 32 is made common to a plurality of lines (three lines in the present example), as shown in FIG. 18, in one end part in the left-to-right direction of the display panel 70, terminals 71-$i$ to 71-$i$+5 for scanning lines are provided so as to correspond to the respective scanning lines 31-$i$ to 31-$i$+5, whereas terminals 72-$j$ and 72-$j$+1 for power supply lines are provided with three lines as a unit, that is, one for each unit of three lines, on one side, for example a lower side in a top-to-bottom direction of the terminal group (pad part) for the scanning lines.

The terminals 71-$i$ to 71-$i$+5 for the scanning lines are electrically connected to the scanning lines 31-$i$ to 31-$i$+5 in one-to-one relation by pieces of wiring 73-$i$ to 73-$i$+5, respectively, whereas the terminals 72-$j$ and 72-$j$+1 for the power supply lines are electrically connected to the power supply lines 32-$i$ to 32-$i$+5 in one-to-three relation by pieces of wiring 74-$j$ and 74-$j$+1, respectively.

However, as is clear from FIG. 18, a wiring layout structure as described above has parts where the pieces of wiring 74-$j$ and 74-$j$+1 cross the pieces of wiring 73-$i$ to 73-$i$+5 on the display panel 70. Thereby, a short circuit tends to occur at the parts where the pieces of wiring 74-$j$ and 74-$j$+1 cross the pieces of wiring 73-$i$ to 73-$i$+5 in an outer edge part of the display panel 70. There is thus a fear of inviting a decrease in yield of the outer edge part (frame part) of the display panel 70.

Further, when a voltage drop and the like of the power supply lines 32 (32-$i$ to 32-$i$+5 in the present example) are taken into consideration, because the driving timing of the power supply line 32 for three lines is made common as an example in the layout example of FIG. 18, the pieces of wiring 74-$j$ and 74-$j$+1 that branch off from the terminals 72-$j$ and 72-$j$+1 for the power supply lines to pixels 20 simply need a thickness of three of the power supply lines 32-$i$ to 32-$i$+5 of the pixel array section 30.

Thus, the pieces of wiring 73-$i$ to 73-$i$+5 of the scanning line side need to be bridged by a different wiring layer than that of the pieces of wiring 74-$j$ and 74-$j$+1. Therefore, the transient of the scanning signals WS transmitted through the pieces of wiring 73-$i$ to 73-$i$+5 becomes blunted, and the transmission speed of the scanning signals WS is decreased. Further, this causes an image quality defect such as shading in an image.

Thus, when the driving timing of a power supply line 32 is made common to a plurality of lines, there are challenges of improving a yield in the outer edge part of the display panel 70 and increasing the transmission speed of the scanning signals WS in the pieces of wiring 73-$i$ to 73-$i$+5 of the scanning line side. A concrete embodiment of a wiring layout structure and a layout method according to the present embodiment for solving the challenges will be described in the following.

Embodiment

Figure 19:
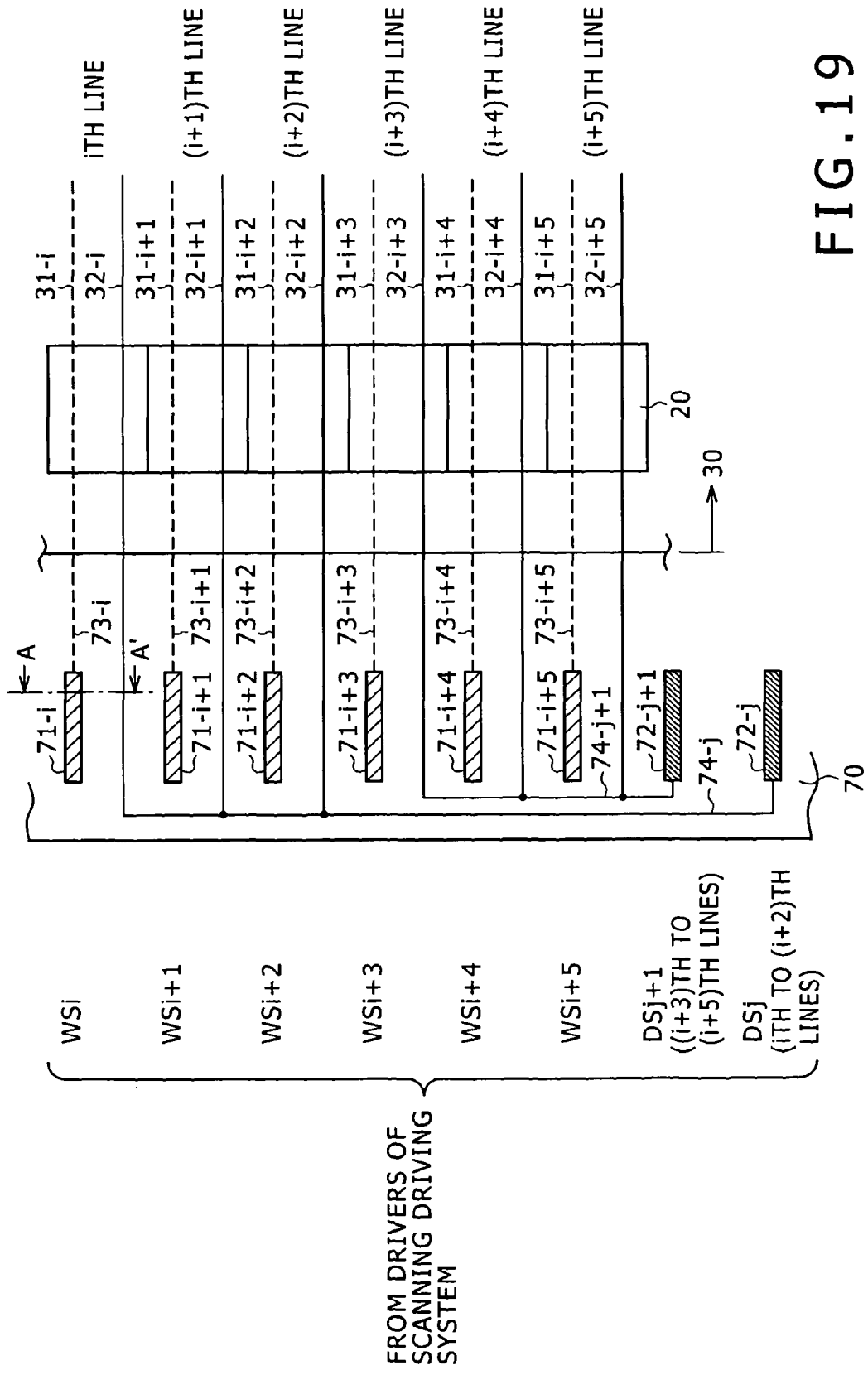
FIG. 19 is a plan view of a layout structure of wiring according to an embodiment of the present invention.

FIG. 19 is a plan view schematically showing a wiring layout structure according to an embodiment of the present invention. In FIG. 19, the same parts as in FIG. 18 are identified by the same reference numerals. In this case, as an example, a layout structure of six lines from an ith line to an (i+5)th line is shown.

In the case of FIG. 18 in which pieces of wiring cross each other, a pad part including the terminals 71-$i$ to 71-$i$+5 for the scanning lines as first terminal group and the terminals 72-*j* and 72-*j*+1 for the power supply lines as second terminal group is disposed in the vicinity of a panel edge of the display panel 70. On the other hand, in the layout structure according to the present embodiment, the pad part is disposed on the pixel array section 30 side as compared with the case of FIG. 18, so that a wiring space is secured between the panel edge and the pad part.

At this time, the terminals 72-*j* and 72-*j*+1 for the power supply lines are laid out at a same position as the terminals 71-*i* to 71-*i*+5 for the scanning lines with respect to the panel edge. Further, with respect to the row arrangement of the pixel array section 30, the order of arrangement of the terminals 72-*j* and 72-*j*+1 for the power supply lines is the reverse of the order of arrangement of the terminals 71-*i* to 71-*i*+5 for the scanning lines. Specifically, in the present example, the terminals 71-*i* to 71-*i*+5 for the scanning lines are arranged in order from the top side of the figure (top edge side of the display panel 70) as in the row arrangement of the pixel array section 30, whereas the terminals 72-*j* and 72-*j*+1 for the power supply lines are arranged in order from the bottom side of the figure (bottom edge side of the display panel 70).

As in FIG. 18, the terminals 71-*i* to 71-*i*+5 for the scanning lines are electrically connected in one-to-one relation to the scanning lines 31-*i* to 31-*i*+5 as control lines of a first control line group by pieces of wiring 73-*i* to 73-*i*+5 as a first wiring group.

On the other hand, as for the terminals 72-*j* and 72-*j*+1 for the power supply lines, pieces of wiring 74-*j* and 74-*j*+1 as a second wiring group are arranged on an opposite side of the terminals 71-*i* to 71-*i*+5 for the scanning lines from the pixel array section 30 on the display panel 70, that is, in a wiring space secured on a panel edge side of the terminals 71-*i* to 71-*i*+5 on the display panel 70, and are electrically connected in one-to-three relation to the power supply lines 32-*i* to 32-*i*+5 as control lines of a second control line group through parts between the terminals 71-*i* to 71-*i*+5 for the scanning lines.

Because a pitch between the terminals 71-*i* to 71-*i*+5 for the scanning lines is generally set small, the line width of wiring parts of the pieces of wiring 74-*j* and 74-*j*+1 for the power supply lines which wiring parts pass through parts between the terminals 71-*i* to 71-*i*+5 for the scanning lines is limited to about the same line width as that of the scanning lines 31 and the power supply lines 32 arranged in the pixel array section 30, for example. On the other hand, wiring parts laid out in the wiring space secured on the panel edge side are less limited in line width than the wiring parts passing through the parts between the terminals 71-*i* to 71-*i*+5 for the scanning lines.

Therefore, the line width of the wiring parts from the terminals 72-*j* and 72-*j*+1 for the power supply lines to the terminals 71-*i* to 71-*i*+5 for the scanning lines in the pieces of wiring 74-*j* and 74-*j*+1 for the power supply lines can be made wider than the line width of the wiring parts passing through the parts between the terminals 71-*i* to 71-*i*+5 for the scanning lines. As a result, the wiring resistance of the wiring parts from the terminals 72-*j* and 72-*j*+1 for the power supply lines to the terminals 71-*i* to 71-*i*+5 for the scanning lines can be set lower than the wiring resistance of the wiring parts passing through the parts between the terminals 71-*i* to 71-*i*+5 for the scanning lines.

By thus adopting a layout structure in which the pieces of wiring 74-*j* and 74-*j*+1 for the power supply lines are arranged on the panel edge side of the terminals 71-*i* to 71-*i*+5 for the scanning lines and in which the terminals 72-*j* and 72-*j*+1 for the power supply lines are electrically connected to the power supply lines 32-*i* to 32-*i*+5 by the pieces of wiring 74-*j* and 74-*j*+1 through the parts between the terminals 71-*i* to 71-*i*+5 for the scanning lines, the pieces of wiring 74-*j* and 74-*j*+1 do not cross the pieces of wiring 73-*i* to 73-*i*+5 in an outer edge part (frame part) of the display panel 70.

Thereby, a short circuit (cross short) attendant on the crossing of wiring does not occur, so that a higher yield in the outer edge part of the display panel 70 can be achieved. Further, it is not necessary to bridge the pieces of wiring 73-*i* to 73-*i*+5 of the scanning line side by a different wiring layer than that of the pieces of wiring 74-*j* and 74-*j*+1 as in the case of adopting the layout structure of FIG. 18, so that the blunting of the transient of the scanning signals WS transmitted through the pieces of wiring 73-*i* to 73-*i*+5 can be prevented. Therefore, the transmission speed of the scanning signals WS can be increased as compared with the case of adopting a structure where bridging is performed by a separate layer.

In addition, because the pieces of wiring 74-*j* and 74-*j*+1 for the power supply lines do not cross each other, the pieces of wiring 74-*j* and 74-*j*+1 do not need to be bridged by separate layers. Therefore, the resistance of the pieces of wiring 74-*j* and 74-*j*+1 for the power supply lines can be lowered. Furthermore, of the pieces of wiring 74-*j* and 74-*j*+1 for the power supply lines, the wiring parts from the terminals 72-*j* and 72-*j*+1 for the power supply lines to the terminals 71-*i* to 71-*i*+5 for the scanning lines can be set lower in resistance than the wiring parts passing through the parts between the terminals 71-*i* to 71-*i*+5 for the scanning lines. As a result, a crosstalk caused by a voltage drop in the pieces of wiring 74-*j* and 74-*j*+1 for the power supply lines can be suppressed, so that higher image quality can be achieved.

Figure 20:
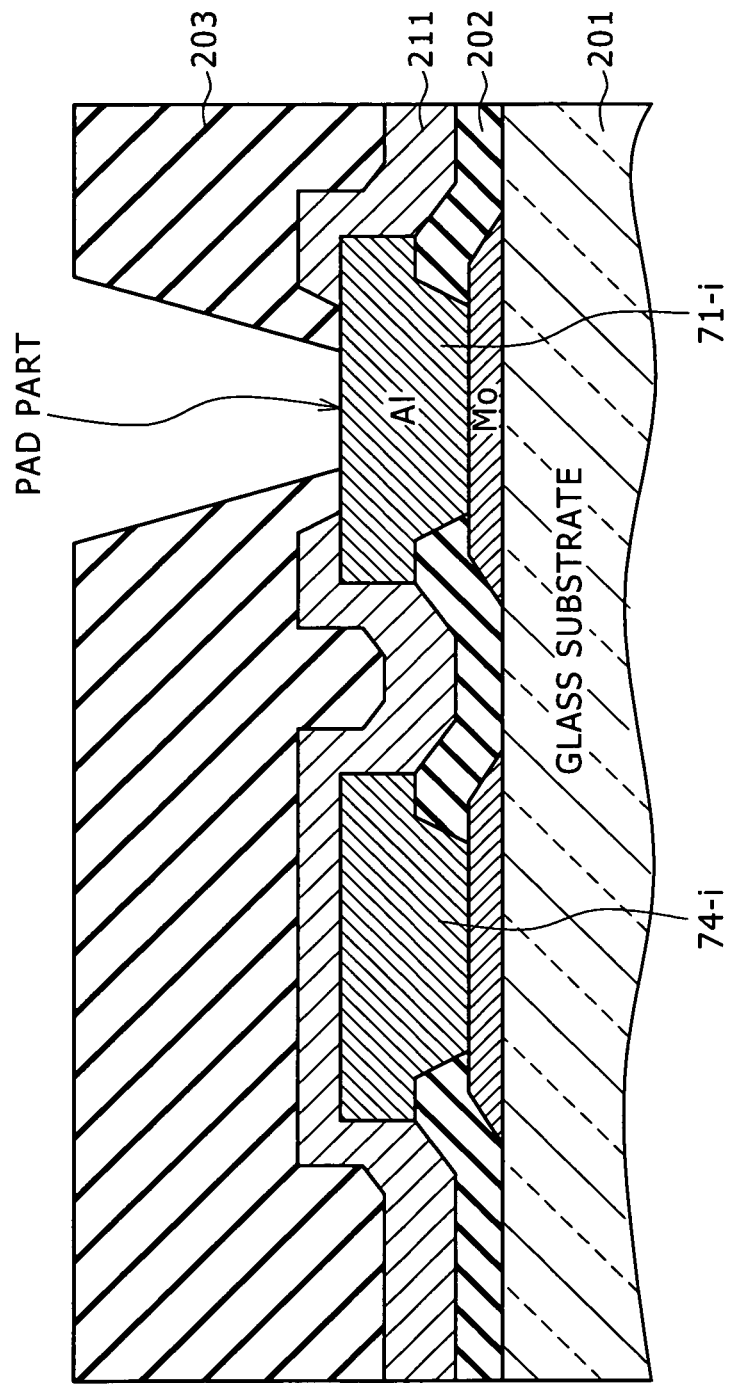
FIG. 20 is a sectional structural view of a section as viewed in the direction of an arrow A-A' in FIG. 19.

FIG. 20 shows a sectional structure of a section as viewed in the direction of an arrow A-A' in FIG. 19, that is, a sectional structure of the terminal 71-*i* for the scanning line and the wiring 74-*j* for the power supply line in the vertical direction of the panel. In FIG. 20, the same parts as in FIG. 3 are identified by the same reference numerals.

In FIG. 20, on a glass substrate 201, the terminal 71-*i* for the scanning line which terminal is made of a metal of a double structure of molybdenum (Mo) and aluminum (Al), for example, is formed, and the wiring 74-*j* for the power supply line which wiring is made of a metal of the same double structure as the terminal 71-*i* is formed between the terminal 71-*i* and the next terminal 71-*i*+1 (not shown) in the same layer as the terminal 71-*i*. The top of the wiring 74-*j* is covered by a passivation film 211 and a planarizing film 203, which films are both an insulating film. The top of the terminal 71-*i* is exposed to the outside to be electrically connected to the writing scanning circuit 40 when the writing scanning circuit 40 is mounted.

As is clear from the sectional structure, the pieces of wiring 74-*j* and 74-*j*+1 for the power supply lines laid out between the terminals 71-*i* to 71-*i*+5 for the scanning lines are covered by the passivation film 211 and the planarizing film 203, and are thus not exposed to the outside. This can prevent a short circuit between the scanning lines 31-*i* to 31-*i*+5 and the pieces of wiring 74-*j* and 74-*j*+1 for the power supply lines at the time of mounting the writing scanning circuit 40. Therefore, a higher yield in the outer edge part of the display panel 70 can be achieved.

In the present embodiment, description has been made of a layout structure in which two terminals (72-*j* and 72-*j*+1) for the power supply lines are arranged as opposed to the group of terminals (71-*i* to 71-*i*+5) for the scanning lines and in which two pieces of wiring 74-*j* and 74-*j*+1 corresponding to the terminals 72-*j* and 72-*j*+1 are arranged. However, even when the number of terminals for the power supply lines and the number of pieces of wiring for the power supply lines are changed, the basic layout structure is unchanged.

Figure 21:
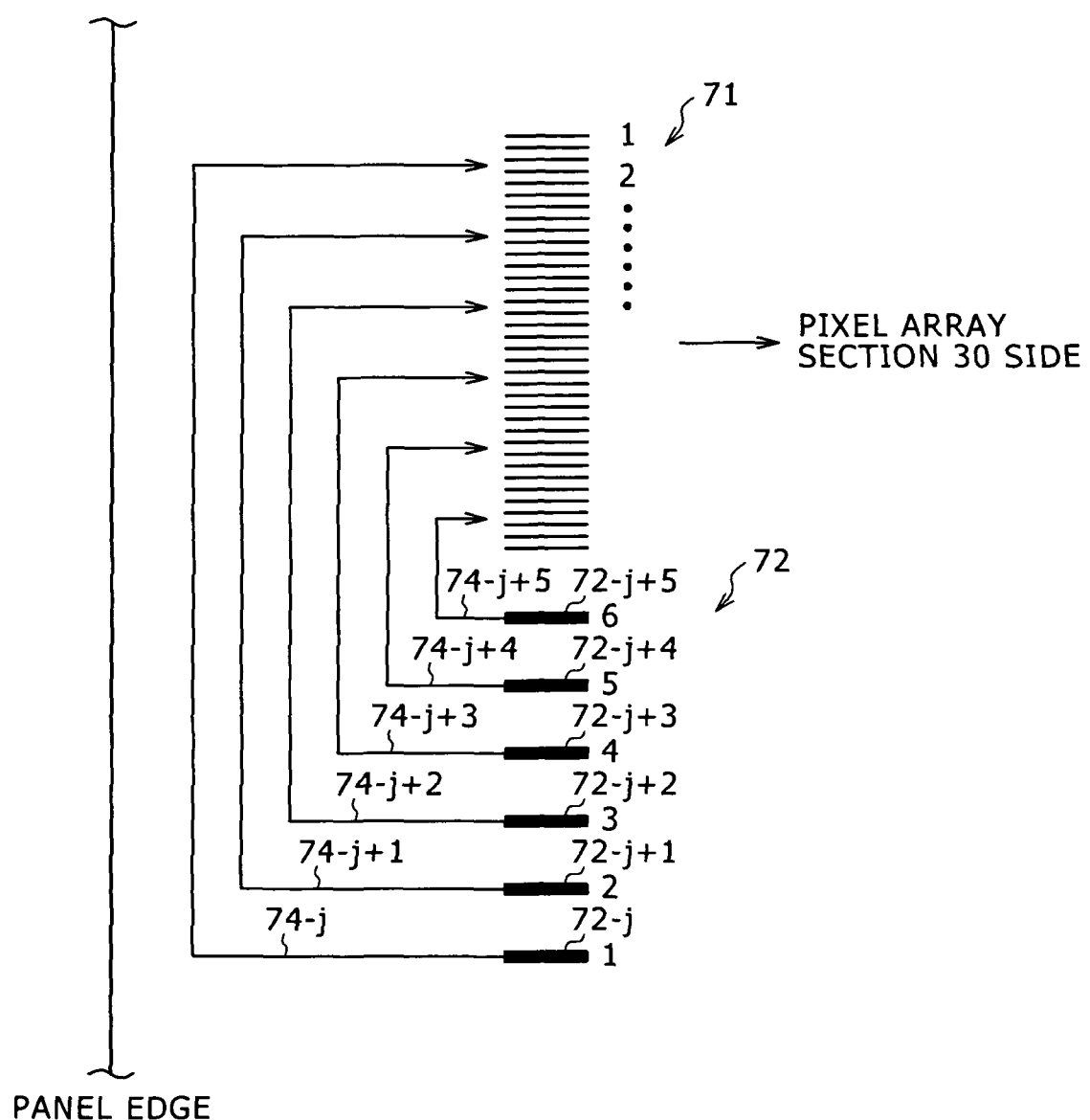
FIG. 21 is a schematic diagram of a layout structure when there are six pieces of wiring.

For example, as shown in FIG. 21, also in a case of arranging six terminals for the power supply lines, with respect to the row arrangement of the pixel array section 30, the order of arrangement of the six terminals 72-$j$ to 72-$j$+5 for the power supply lines is the reverse of the order of arrangement of terminals of the terminal group (pad part) 71 for the scanning lines. For example, the terminals of the terminal group 71 for the scanning lines are arranged in order from the top side of the figure (top edge side of the display panel 70) as in the row arrangement of the pixel array section 30, whereas the six terminals 72-$j$ to 72-$j$+5 are arranged in order from the bottom side of the figure (bottom edge side of the display panel 70).

Then, it suffices to arrange six pieces of wiring 74-$j$ to 74-$j$+5 corresponding to the six terminals 72-$j$ to 72-$j$+5 on the panel edge side of the terminal group 71 for the scanning lines, and electrically connect the six terminals 72-$j$ to 72-$j$+5 and power supply lines 32-$i$ to 32-$i$+5 to each other in a predetermined correspondence through parts between terminals of the terminal group 71 for the scanning lines by these pieces of wiring 74-$j$ to 74-$j$+5.

However, when the terminal group 72 for the power supply lines are arranged together on one side (lower side in the present example) of the terminal group 71 for the scanning lines, a difference occurring in wiring length between the six pieces of wiring 74-$j$ to 74-$j$+5 causes a difference in the resistance value of wiring resistance between the pieces of wiring 74-$j$ to 74-$j$+5. Therefore, voltage drops due to the wiring resistances of the pieces of wiring 74-$j$ to 74-$j$+5 for the power supply lines transmitting power supply voltage in particular cause a difference in power supply voltage between the pieces of wiring 74-$j$ to 74-$j$+5.

A first to a third example of application of the present embodiment to be described later are made to suppress the difference in wiring resistance value between the pieces of wiring of the wiring group for the power supply lines. The first to third examples of application will also be described by taking as an example a case where power supply lines 32-1 to 32-$m$ are driven by six pieces of wiring 74-$j$ to 74-$j$+5.

First Example of Application

Figure 22:
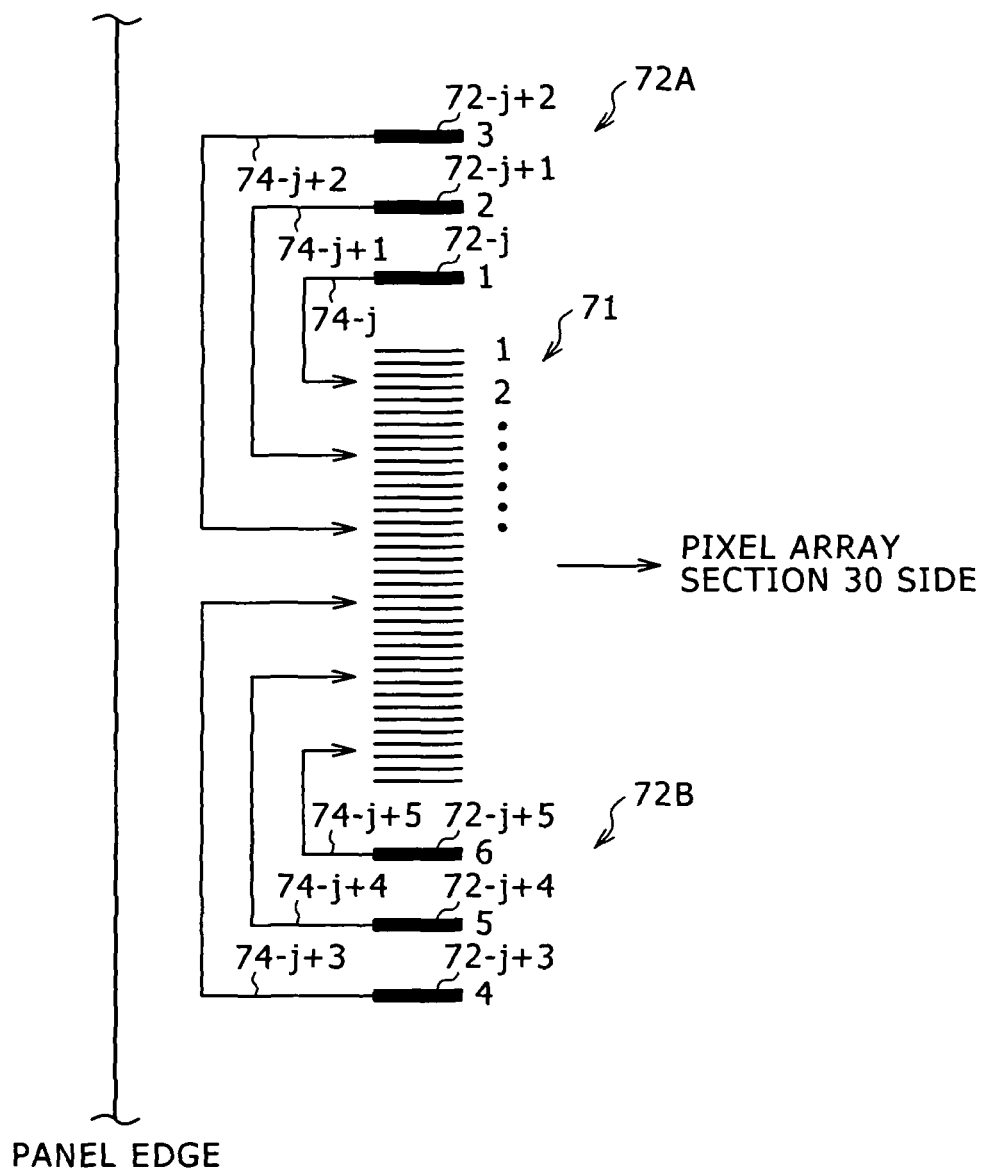
FIG. 22 is a schematic diagram of a layout structure of wiring according to a first example of application of the present embodiment.

FIG. 22 is a schematic diagram of a layout structure of wiring according to the first example of application of the present embodiment. In FIG. 22, the same parts as in FIG. 21 are identified by the same reference numerals.

In the present first example of application, the terminals 72-$j$ to 72-$j$+5 of the terminal group 72 for the power supply lines are divided into two groups. The terminals 72-$j$, 72-$j$+1, and 72-$j$+2 belonging to one group are arranged on a side above the terminal group 71 for the scanning lines, and the terminals 72-$j$+3, 72-$j$+4, and 72-$j$+5 belonging to the other group are arranged on the a side below the terminal group 71 for the scanning lines.

Also in this case, the order of arrangement of the terminals 72-$j$, 72-$j$+1, and 72-$j$+2 of one terminal group 72A and the terminals 72-$j$+3, 72-$j$+4, and 72-$j$+5 of the other terminal group 72B is the reverse of the order of arrangement of the terminals of the terminal group 71 for the scanning lines.

Thus, dividing and arranging the terminals 72-$j$ to 72-$j$+5 of the terminal group 72 for the power supply lines on both the sides above and below the terminal group 71 for the scanning lines eliminates wiring that has an extremely long wiring length as with the pieces of wiring 74-$j$, 74-$j$+1, and 74-$j$+2 in the foregoing embodiment. It is therefore possible to lower a wiring resistance value as a whole, and reduce a difference in wiring resistance value between pieces of wiring.

Second Example of Application

Figure 23:
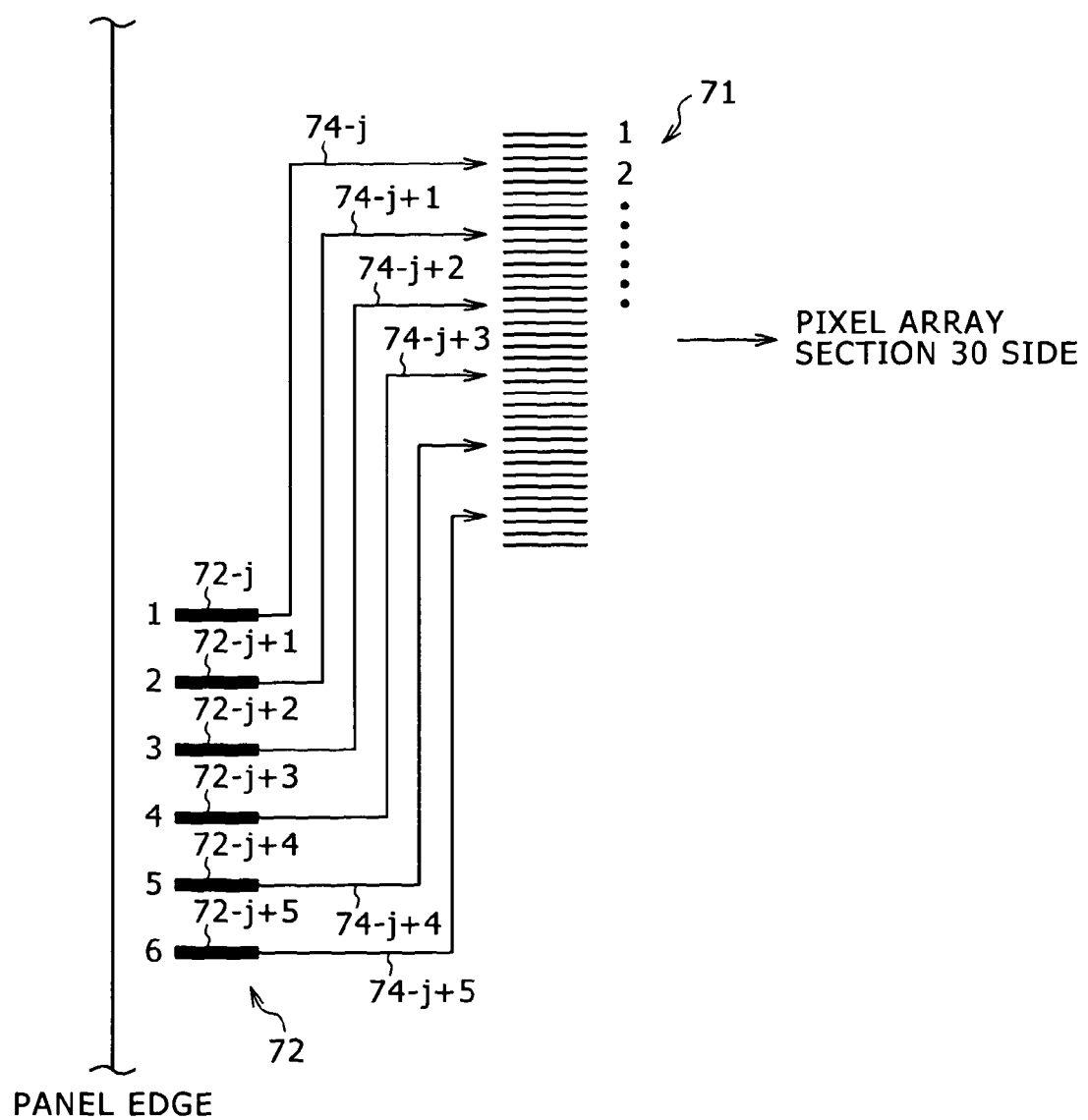
FIG. 23 is a schematic diagram of a layout structure of wiring according to a second example of application of the present embodiment.

FIG. 23 is a schematic diagram of a layout structure of wiring according to the second example of application of the present embodiment. In FIG. 23, the same parts as in FIG. 22 are identified by the same reference numerals.

In the present second example of application, the terminals 72-$j$ to 72-$j$+5 of the terminal group 72 for the power supply lines are laid out at a position different from that of the terminals 71-$i$ to 71-$i$+5 for the scanning lines with respect to the panel edge, specifically in a wiring space secured between the panel edge of the display panel 70 and the terminal group 71 for the scanning lines, that is, on the panel edge side of the terminals 71-$i$ to 71-$i$+5 for the scanning lines.

With respect to the row arrangement of the pixel array section 30, the order of arrangement of the terminals 72-$j$ to 72-$j$+5 of the terminal group 72 for the power supply lines is the same as the order of arrangement of the terminals of the terminal group 71 for the scanning lines. Specifically, in the present example, the terminals of the terminal group 71 for the scanning lines are arranged in order from the top side of the figure (top edge side of the display panel 70) as in the row arrangement of the pixel array section 30, while the terminals 72-$j$ and 72-$j$+1 of the terminal group 72 for the power supply lines are also arranged in order from the top side of the figure.

Thus, making the order of arrangement of the terminals 72-$j$ to 72-$j$+5 of the terminal group 72 for the power supply lines the same as the order of arrangement of the terminals of the terminal group 71 for the scanning lines eliminates wiring that has an extremely long wiring length as with the pieces of wiring 74-$j$, 74-$j$+1, and 74-$j$+2 in the foregoing embodiment. It is therefore possible to lower a wiring resistance value as a whole, and reduce a difference in wiring resistance value between pieces of wiring.

Third Example of Application

Figure 24:
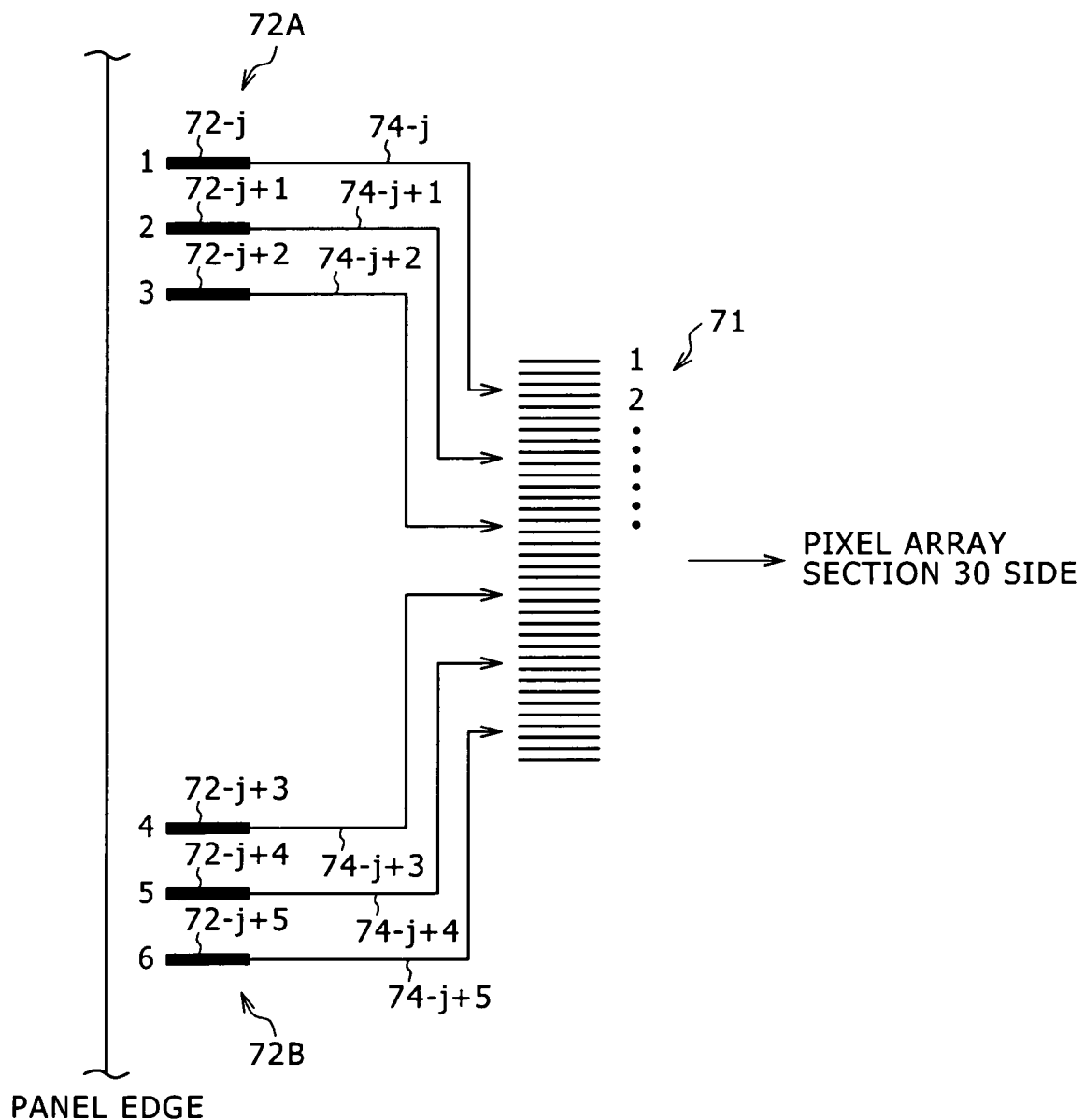
FIG. 24 is a schematic diagram of a layout structure of wiring according to a third example of application of the present embodiment.

FIG. 24 is a schematic diagram of a layout structure of wiring according to the third example of application of the present embodiment. In FIG. 24, the same parts as in FIG. 22 are identified by the same reference numerals.

In the present third example of application, in which the order of arrangement of the terminals 72-$j$ to 72-$j$+5 of the terminal group 72 for the power supply lines is the same as the order of arrangement of the terminals of the terminal group 71 for the scanning lines, the terminals 72-$j$ to 72-$j$+5 of the terminal group 72 for the power supply lines are divided into two groups, and the terminals 72-$j$, 72-$j$+1, and 72-$j$+2 belonging to one group are arranged on a side above the terminals of the terminal group 71 for the scanning lines and the terminals 72-$j$+3, 72-$j$+4, and 72-$j$+5 belonging to the other group are arranged on a side below the terminals of the terminal group 71 for the scanning lines.

In the case where the order of arrangement of the terminals 72-$j$ to 72-$j$+5 of the terminal group 72 for the power supply lines is the same as the order of arrangement of the terminals of the terminal group 71 for the scanning lines, thus dividing and arranging the terminals 72-$j$ to 72-$j$+5 of the terminal group 72 for the power supply lines on both the sides above and below the terminal group 71 for the scanning lines eliminates wiring that has an extremely long wiring length. It is therefore possible to lower a wiring resistance value as a whole, and reduce a difference in wiring resistance value between pieces of wiring.

In addition, as a more desirable form, a constitution can be adopted in which the terminals 72-*j* to 72-*j*+5 of the terminal group 72 for the power supply lines are arranged immediately beside the terminal group 71 for the scanning lines. According to this layout structure, the wiring lengths of the respective pieces of wiring 74-*j* to 74-*j*+5 of a wiring group 74 for the power supply lines can be minimized, and the wiring lengths of the respective pieces of wiring 74-*j* to 74-*j*+5 can be made substantially equal to each other. It is therefore possible to lower a wiring resistance value as a whole, and reduce a difference in wiring resistance value between the pieces of wiring to substantially zero.

(From Terminal Groups to Panel Edge)

Consideration will now be given to a part from the terminal groups (hereinafter described as a "pad part") for the scanning lines and for the power supply lines to the panel edge of the display panel 70.

Figure 25:
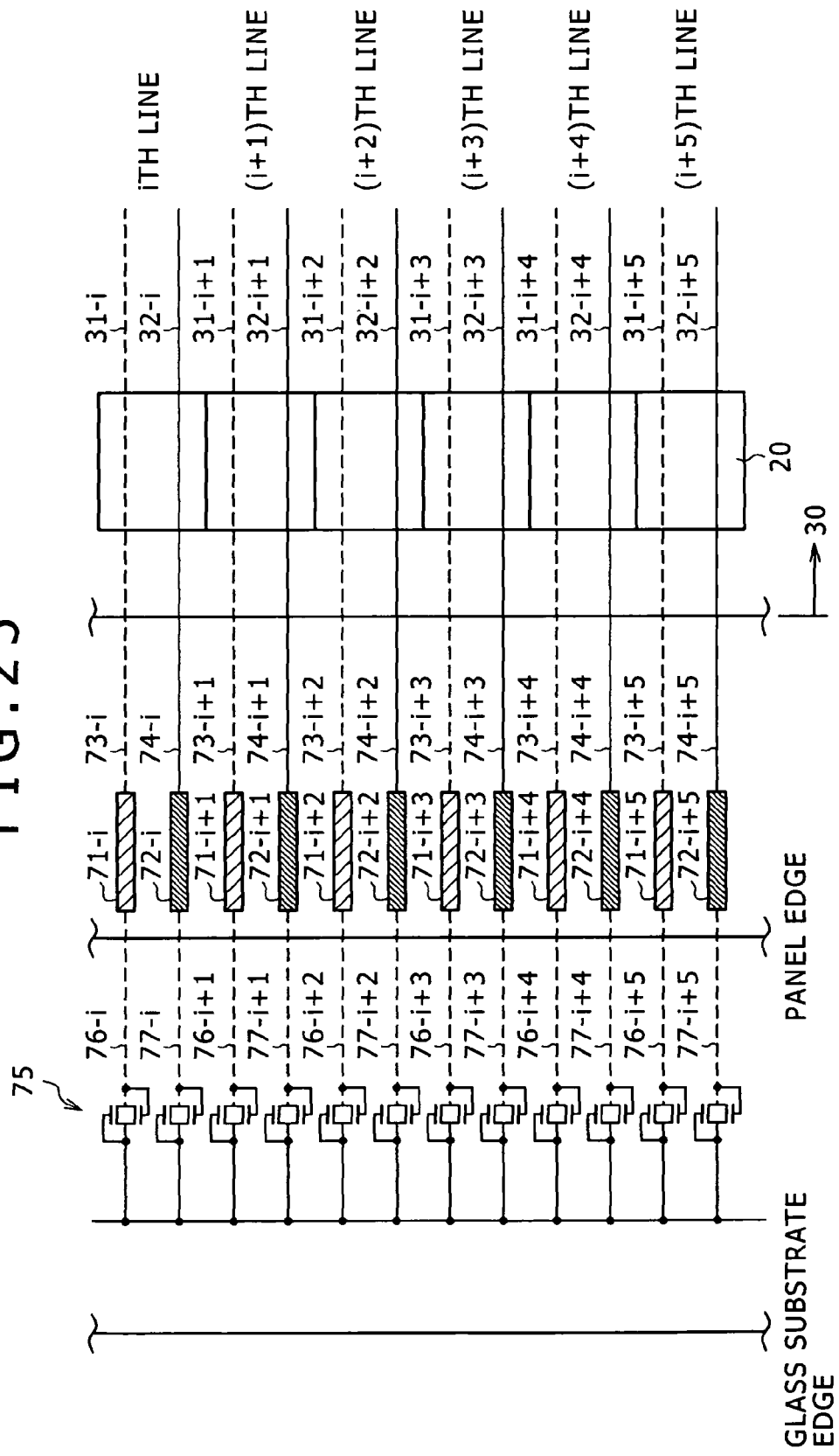
FIG. 25 is a schematic diagram showing a typical configuration of an electrostatic protection structure from a pad part to a glass substrate edge.

Generally, at a time of producing the display panel 70, as shown in FIG. 25, electrostatic protection diodes 75 are provided between the pad part and the substrate edge side of a glass substrate (corresponding to the glass substrate 201 in FIG. 3) for the purpose of protecting circuit constituent elements and the like of the pixel array section 30 from static electricity in a manufacturing stage, and wiring from the panel edge to the electrostatic protection diodes 75 is performed by a metal forming a gate electrode, for example molybdenum (Mo).

In FIG. 25, the same parts as in FIG. 17 are identified by the same reference numerals. From the pad part to the glass substrate side, pieces of molybdenum wiring 76-*i* to 76-*i*+5 for scanning lines are routed to terminals 71-*i* to 71-*i*+5 for the scanning lines, and pieces of molybdenum wiring 77-*i* to 77-*i*+5 for power supply lines are routed to terminals 72-*i* to 72-*i*+5 for the power supply lines.

Figure 26:
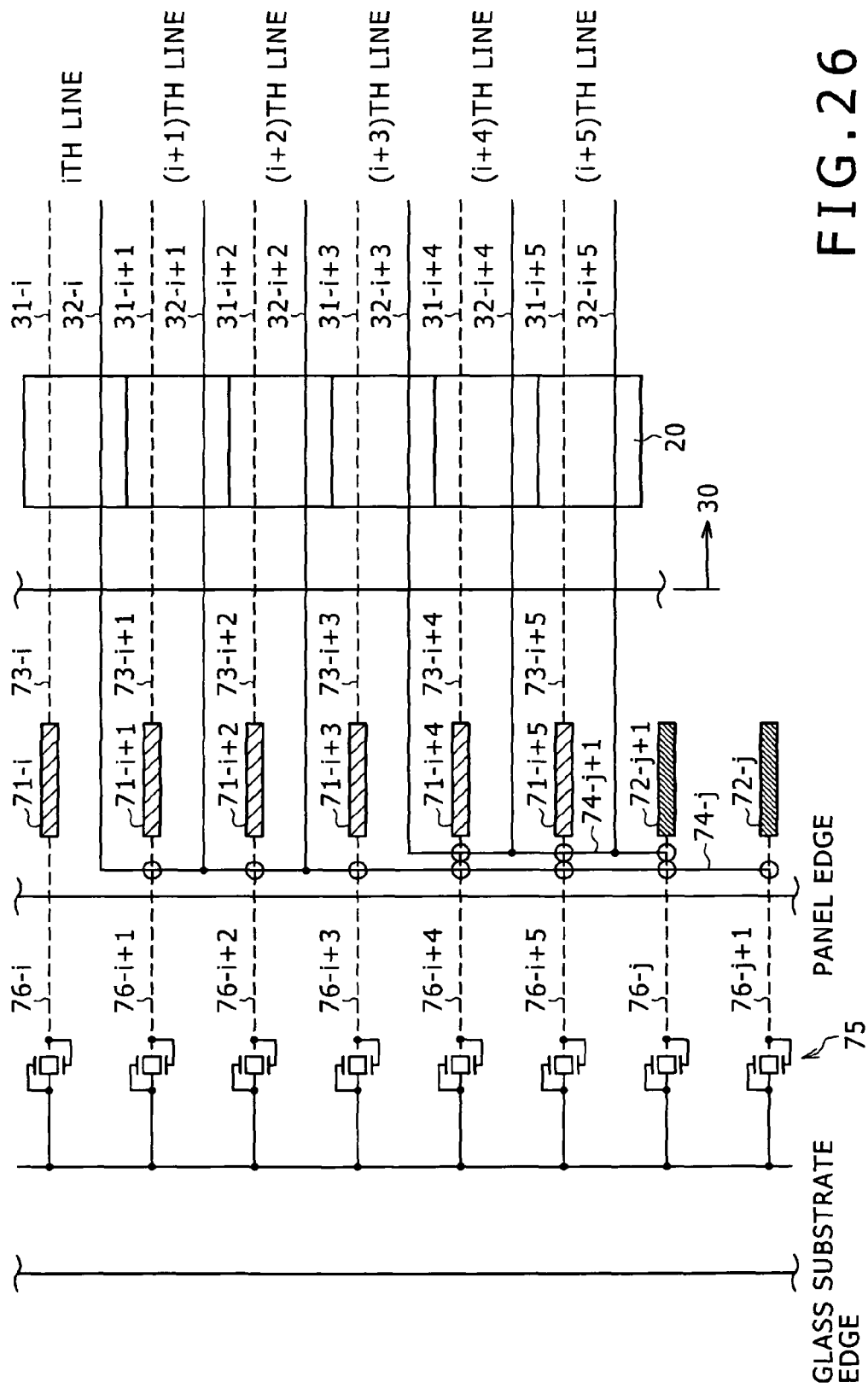
FIG. 26 is a schematic diagram showing a configuration when the electrostatic protection structure is unfolded in the layout structure according to the present embodiment.

This electrostatic protection structure is unfolded in the layout structure according to the foregoing embodiment as in FIG. 26. That is, in the layout structure shown in FIG. 26, there are parts (parts in circles in the figure) between the pad part and the glass substrate edge where pieces of wiring 74-*j* and 74-*j*+1 for the power supply lines cross the pieces of molybdenum wiring 76-*i* to 76-*i*+5 for the scanning lines and the pieces of molybdenum wiring 77-*i* to 77-*i*+5 for the power supply lines. There is a fear that the crossing of the wiring at the parts may cause a short circuit (cross short).

However, cross shorts at the parts where the crossing of the wiring occurs can be detected by a short check between terminals of the pad part in an inspection process of the manufacturing stage, and cross shorts can be repaired by means such as a laser repair. In addition, the shorts occur from the pad part to the peripheral part, and therefore even when the line of an electrostatic protection diode 75 is cut off by a repair, driving is not affected at all because all the lines of the electrostatic protection diodes 75 are cut off by cutting the glass substrate when the display panel 70 is ultimately formed.

This means that a short check and a measure such as a laser repair prevent cross shorts from the pad part to the glass substrate edge from affecting the yield even when a layout structure as in the foregoing embodiment is adopted in which a wiring group for power supply lines are arranged in a wiring space secured on the panel edge side of a terminal group for scanning lines, and in which terminals for the power supply lines are electrically connected in a predetermined correspondence with the power supply lines 32-*i* to 32-*i*+5 by pieces of wiring of the wiring group for the power supply lines through parts between terminals of the terminal group for the scanning lines.

[Examples of Modification]

Incidentally, while the foregoing embodiment has been described by taking as an example a case where control lines for making driving timing for a plurality of lines common are the power supply lines 32, similar action and effect to that of the foregoing embodiment can be obtained in a case where control lines for making driving timing for a plurality of lines common are the scanning lines 31.

In addition, while in the foregoing embodiment, the present invention is applied to an organic EL display device having a configuration where a pixel 20 has two transistors, that is, a driving transistor 22 and a writing transistor 23, the pixel configuration is not limited to this. The present invention is also applicable to an organic EL display device having a pixel configuration further including, for example, a switching transistor for controlling emission/non-emission of an organic EL element 21 and a switching transistor for selectively writing a reference potential Vofs and a low potential Vini for initializing the gate potential and the source potential of the driving transistor 22.

Thus, the combination of the drivers of the scanning driving system to which the present embodiment is applied is not limited to the combination of the writing scanning circuit 40 and the power supply scanning circuit 50. The embodiment is also applicable to a combination of two drivers driving the various switching transistors described above, and similar action and effect to that of the foregoing embodiment can be obtained.

Further, while the foregoing embodiment has been described by taking as an example a case where the present invention is applied to an organic EL display device using an organic EL element as an electrooptic element of a pixel circuit 20, the present invention is not limited to this example of application. Specifically, the present invention is applicable to display devices in general using a current-driven type electrooptic element (light emitting element) whose light emission luminance changes according to the value of a current flowing through the device, such as an inorganic EL element, an LED (light emitting diode) element, or a semiconductor laser element.

[Examples of Application]

A display device according to an embodiment of the present invention described above is, for example, applicable to display devices of electronic devices in all fields that display a video signal input thereto or a video signal generated therein as an image or video, such as various electronic devices shown in FIGS. 27 to 31G, for example digital cameras, notebook personal computers, portable terminal devices such as portable telephones, and video cameras.

By thus using a display device according to an embodiment of the present invention as display devices of electronic devices in all fields, as is clear from the description of the foregoing embodiments, a display device according to an embodiment of the present invention makes it possible to reduce the circuit scale of the scanning driving system as a whole, and reduce the size of the panel module, thus contributing to miniaturization of a device main body in various electronic devices.

Incidentally, a display device according to an embodiment of the present invention includes a display device in the form of a sealed module. For example, a display module formed by attaching a counter part such as a transparent glass to the pixel array section 30 corresponds to a display device in the form of a sealed module. This transparent counter part may be provided with a color filter, a protective film and the like, and a light shielding film as described above. Incidentally, the display module may be provided with a circuit part, an FPC (Flexible Printed Circuit) or the like for externally inputting or outputting a signal and the like to the pixel array section.

Concrete examples of electronic devices to which an embodiment of the present invention is applied will be described in the following.

Figure 27:
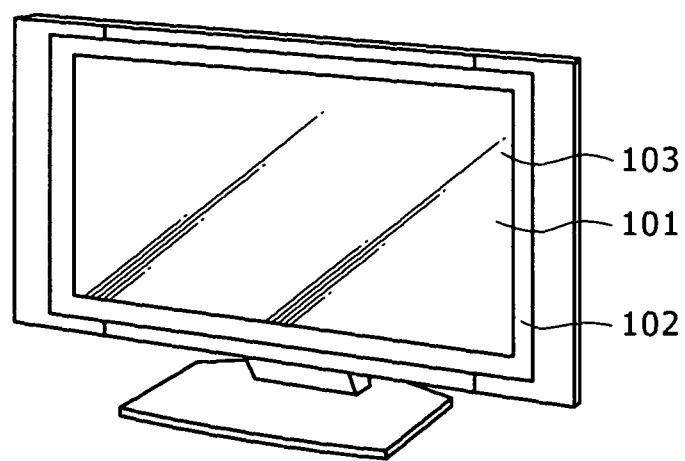
FIG. 27 is a perspective view of an external appearance of a television set to which an embodiment of the present invention is applied.

FIG. 27 is a perspective view of an external appearance of a television set to which an embodiment of the present invention is applied. The television set according to the present example of application includes a video display screen part 101 composed of a front panel 102, a filter glass 103 and the like, and is fabricated using a display device according to an embodiment of the present invention as the video display screen part 101.

Figure 28A:
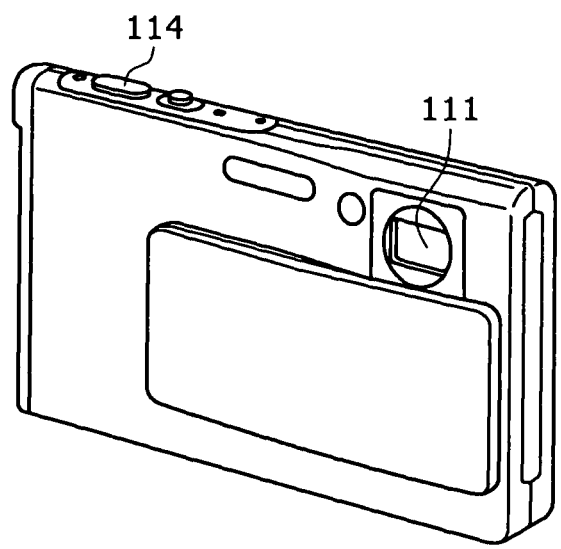
FIGS. 28A and 28B are perspective views of an external appearance of a digital camera to which an embodiment of the present invention is applied, FIG. 28A being a perspective view of the digital camera as viewed from a front side, and FIG. 28B being a perspective view of the digital camera as viewed from a back side.
Figure 28B:
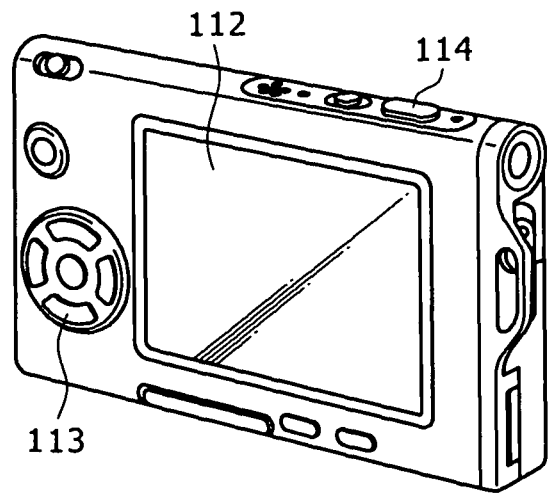

FIGS. 28A and 28B are perspective views of an external appearance of a digital camera to which an embodiment of the present invention is applied. FIG. 28A is a perspective view of the digital camera as viewed from a front side, and FIG. 28B is a perspective view of the digital camera as viewed from a back side. The digital camera according to the present example of application includes a light emitting part 111 for flashlight, a display part 112, a menu switch 113, a shutter button 114, and the like. The digital camera is fabricated using a display device according to an embodiment of the present invention as the display part 112.

Figure 29:
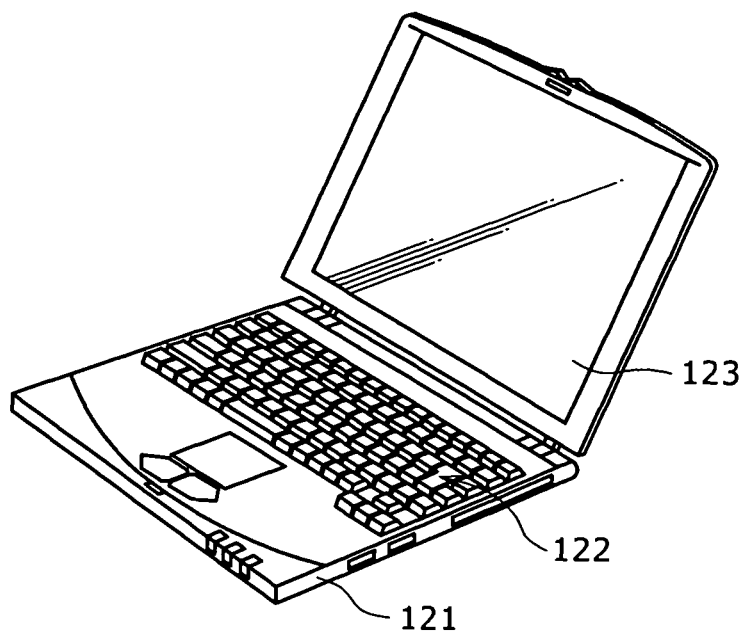
FIG. 29 is a perspective view of an external appearance of a notebook personal computer to which an embodiment of the present invention is applied.

FIG. 29 is a perspective view of an external appearance of a notebook personal computer to which an embodiment of the present invention is applied. The notebook personal computer according to the present example of application includes a keyboard 122 operated to input characters and the like, a display part 123 for displaying an image, and the like in a main unit 121. The notebook personal computer is fabricated using a display device according to an embodiment of the present invention as the display part 123.

Figure 30:
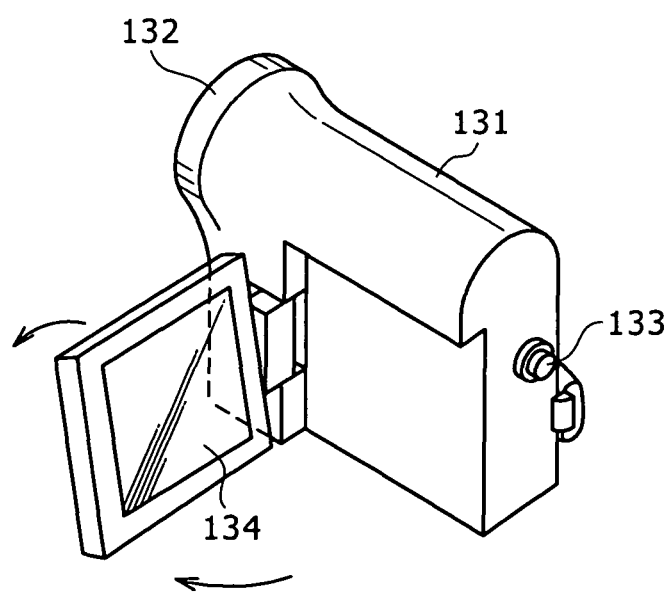
FIG. 30 is a perspective view of an external appearance of a video camera to which an embodiment of the present invention is applied.

FIG. 30 is a perspective view of an external appearance of a video camera to which an embodiment of the present invention is applied. The video camera according to the present example of application includes a main unit 131, a lens 132 for taking a subject in a side surface facing frontward, a start/stop switch 133 at a time of picture taking, a display part 134, and the like. The video camera is fabricated using a display device according to an embodiment of the present invention as the display part 134.

FIGS. 31A, 31B, 31C, 31D, 31E, 31F, and 31G are diagrams showing an external appearance of a portable terminal device, for example a portable telephone to which an embodiment of the present invention is applied. FIG. 31A is a front view of the portable telephone in an opened state, FIG. 31B is a side view of the portable telephone in the opened state, FIG. 31C is a front view of the portable telephone in a closed state, FIG. 31D is a left side view, FIG. 31E is a right side view, FIG. 31F is a top view, and FIG. 31G is a bottom view. The portable telephone according to the present example of application includes an upper side casing 141, a lower side casing 142, a coupling part (a hinge part in this case) 143, a display 144, a sub-display 145, a picture light 146, a camera 147, and the like. The portable telephone according to the present example of application is fabricated using a display device according to an embodiment of the present invention as the display 144 and the sub-display 145.

The present application contains subject matter related to that disclosed in Japanese Priority Patent Application JP 2008-145376 filed in the Japan Patent Office on Jun. 3, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device wherein in a plan view of a layout structure of wiring, the display device comprising:
    a first terminal group of scanning line terminals, a first group of power supply lines, and a matrix of pixels,
    wherein a first power wiring line is electrically connected to a power supply line of the first group and a different power supply line of the first group, the first terminal group being between a first group of the pixels and said first power wiring line,
    wherein one of the pixels is electrically connected to said power supply line of the first group and a scanning line, said scanning line being electrically connected to one of the scanning line terminals from the first terminal group,
    wherein said one of the pixels has a writing transistor and a driving transistor, said scanning line being electrically connected to a gate electrode of the writing transistor,
    wherein a line width of said first power wiring line is wider than a line width of said scanning line.

2. The display device according to claim 1, wherein said first terminal group of scanning line terminals, said first group of power supply lines, and said matrix of the pixels are on a display panel.

3. The display device according to claim 1, wherein said first power wiring line is electrically connected to an electrostatic protection diode.

4. The display device according to claim 1, wherein a different one of the pixels is electrically connected to said different power supply line of the first group and a different scanning line, said different scanning line being electrically connected to a different one of the scanning line terminals from the first terminal group.

5. The display device according to claim 1, wherein a gate electrode of the driving transistor is electrically connected to a drain/source electrode of the writing transistor.

6. The display device according to claim 1, wherein said power supply line is electrically connected to a drain/source electrode of the driving transistor, a source/drain electrode of the driving transistor being electrically connected to an anode electrode of an organic EL element.

7. The display device according to claim 1, further comprising:
    a second terminal group of scanning line terminals and a second group of power supply lines,
    wherein a second power wiring line is electrically connected to a power supply line of the second group and a different power supply line of the second group, the second terminal group being between a second group of the pixels and said second power wiring line.

8. The display device according to claim 7, wherein said second power wiring line is between said first power wiring line and said first terminal group.

9. The display device according to claim 7, wherein said first power wiring line is electrically connected to an electrostatic protection diode.

* * * * *